United States Patent
Chang et al.

(10) Patent No.: US 9,704,751 B1
(45) Date of Patent: Jul. 11, 2017

(54) SEMICONDUCTOR DEVICE AND METHOD FOR FABRICATING THE SAME

(71) Applicant: Taiwan Semiconductor Manufacturing Co., Ltd., Hsinchu (TW)

(72) Inventors: Che-Cheng Chang, New Taipei (TW); Chih-Han Lin, Hsinchu (TW); Horng-Huei Tseng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/054,138

(22) Filed: Feb. 26, 2016

(51) Int. Cl.
*H01L 29/78* (2006.01)
*H01L 29/06* (2006.01)
*H01L 21/8234* (2006.01)
*H01L 21/308* (2006.01)
*H01L 21/311* (2006.01)
*H01L 27/088* (2006.01)

(52) U.S. Cl.
CPC .. *H01L 21/823431* (2013.01); *H01L 21/3083* (2013.01); *H01L 21/311* (2013.01); *H01L 21/823462* (2013.01); *H01L 27/0886* (2013.01)

(58) Field of Classification Search
CPC ......... H01L 27/0886; H01L 21/823431; H01L 21/823821; H01L 21/845; H01L 27/0924; H01L 27/1211; H01L 29/41791; H01L 29/66795; H01L 29/785; H01L 29/7851; H01L 29/0657
See application file for complete search history.

(56) References Cited

U.S. PATENT DOCUMENTS

| 9,559,192 | B1* | 1/2017 | Lee | H01L 29/6681 |
| 2007/0176245 | A1* | 8/2007 | Kim | H01L 29/66621 257/401 |
| 2007/0278576 | A1* | 12/2007 | Kim | H01L 29/66621 257/347 |
| 2008/0023754 | A1* | 1/2008 | Baek | H01L 21/823437 257/330 |
| 2008/0057634 | A1* | 3/2008 | Lee | H01L 29/66795 438/156 |
| 2009/0111254 | A1* | 4/2009 | Yang | H01L 21/823807 438/587 |
| 2009/0278183 | A1* | 11/2009 | Lee | H01L 29/41791 257/296 |

(Continued)

*Primary Examiner* — Khiem D Nguyen
*Assistant Examiner* — Pauline Vu
(74) *Attorney, Agent, or Firm* — Jianq Chyun IP Office

(57) ABSTRACT

A substrate having a first area and a second area is provided. The substrate is patterned to form trenches in the substrate and semiconductor fins between the trenches, wherein the semiconductor fins comprises first semiconductor fins distributed in the first area and second semiconductor fins distributed in the second area. A first fin cut process is performed in the first area to remove portions of the first semiconductor fins. Insulators are formed in the trenches after the first fin cut process is performed. A second fin cut process is performed in the second area to remove portions of the second semiconductor fins until concaves are formed between the insulators in the second area. A gate stack is formed to partially cover the first semiconductor fins, the second semiconductor fins and the insulators.

20 Claims, 27 Drawing Sheets

(56) References Cited

U.S. PATENT DOCUMENTS

| | | | |
|---|---|---|---|
| 2012/0091528 A1* | 4/2012 | Chang | H01L 29/7848 257/347 |
| 2013/0277720 A1* | 10/2013 | Kim | H01L 29/785 257/288 |
| 2013/0330889 A1* | 12/2013 | Yin | H01L 21/823821 438/197 |
| 2014/0264488 A1* | 9/2014 | Fronheiser | H01L 29/66795 257/288 |
| 2014/0353801 A1* | 12/2014 | Jacob | H01L 21/761 257/618 |
| 2015/0008484 A1* | 1/2015 | Cea | H01L 29/66545 257/192 |
| 2015/0035046 A1* | 2/2015 | Kim | H01L 29/42392 257/327 |
| 2015/0147874 A1* | 5/2015 | Huang | H01L 21/823431 438/514 |
| 2015/0187571 A1* | 7/2015 | Fan | H01L 29/0653 257/401 |
| 2015/0214117 A1* | 7/2015 | Cheng | H01L 29/785 438/504 |
| 2015/0214341 A1* | 7/2015 | Shin | H01L 29/66818 257/401 |
| 2015/0243739 A1* | 8/2015 | Chen | H01L 29/7851 257/623 |
| 2015/0294912 A1* | 10/2015 | Xie | H01L 27/0886 438/283 |
| 2015/0325646 A1* | 11/2015 | Lai | H01L 29/7851 257/369 |
| 2015/0333156 A1* | 11/2015 | Cheng | H01L 29/785 257/623 |
| 2016/0163604 A1* | 6/2016 | Xie | H01L 21/823878 257/401 |
| 2016/0247876 A1* | 8/2016 | Chung | H01L 29/0649 |
| 2016/0284706 A1* | 9/2016 | Chung | H01L 27/0924 |
| 2016/0315080 A1* | 10/2016 | Song | H01L 29/0653 |

\* cited by examiner

SEMICONDUCTOR DEVICE AND METHOD FOR FABRICATING THE SAME

BACKGROUND

As the semiconductor devices keeps scaling down in size, three-dimensional multi-gate structures, such as the fin-type field effect transistor (FinFET), have been developed to replace planar Complementary Metal Oxide Semiconductor (CMOS) devices. A structural feature of the FinFET is the silicon-based fin that extends upright from the surface of the substrate, and the gate wrapping around the conducting channel that is formed by the semiconductor fin further provides a better electrical control over the channel.

During fabrication of FinFETs, the semiconductor fins are patterned by fin cut last process to remove unwanted portions of the semiconductor fins, and after the fin cut process, shallow trench isolations (STI) and gate stacks are then formed. During the fin cut process, a patterned photoresist layer is formed to partially cover the semiconductor fins and the unwanted portions of the semiconductor fins are etched. Since the patterned photoresist layer used in fin cut process is formed over the substrate and may not be sufficient thick to protect the semiconductor fins covered thereby, especially the semiconductor fins distributed in a dense area (e.g., core area) of a semiconductor device. Thus, fin damage occurs during the fin cut process and stability of the fin cut process deteriorates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2G' and FIG. 3G' schematically illustrate modifications of FIG. 2G and FIG. 3G.

FIG. 2H' and FIG. 3H' schematically illustrate modifications of FIG. 2H and FIG. 3H.

DETAILED DESCRIPTION

Figure 1:
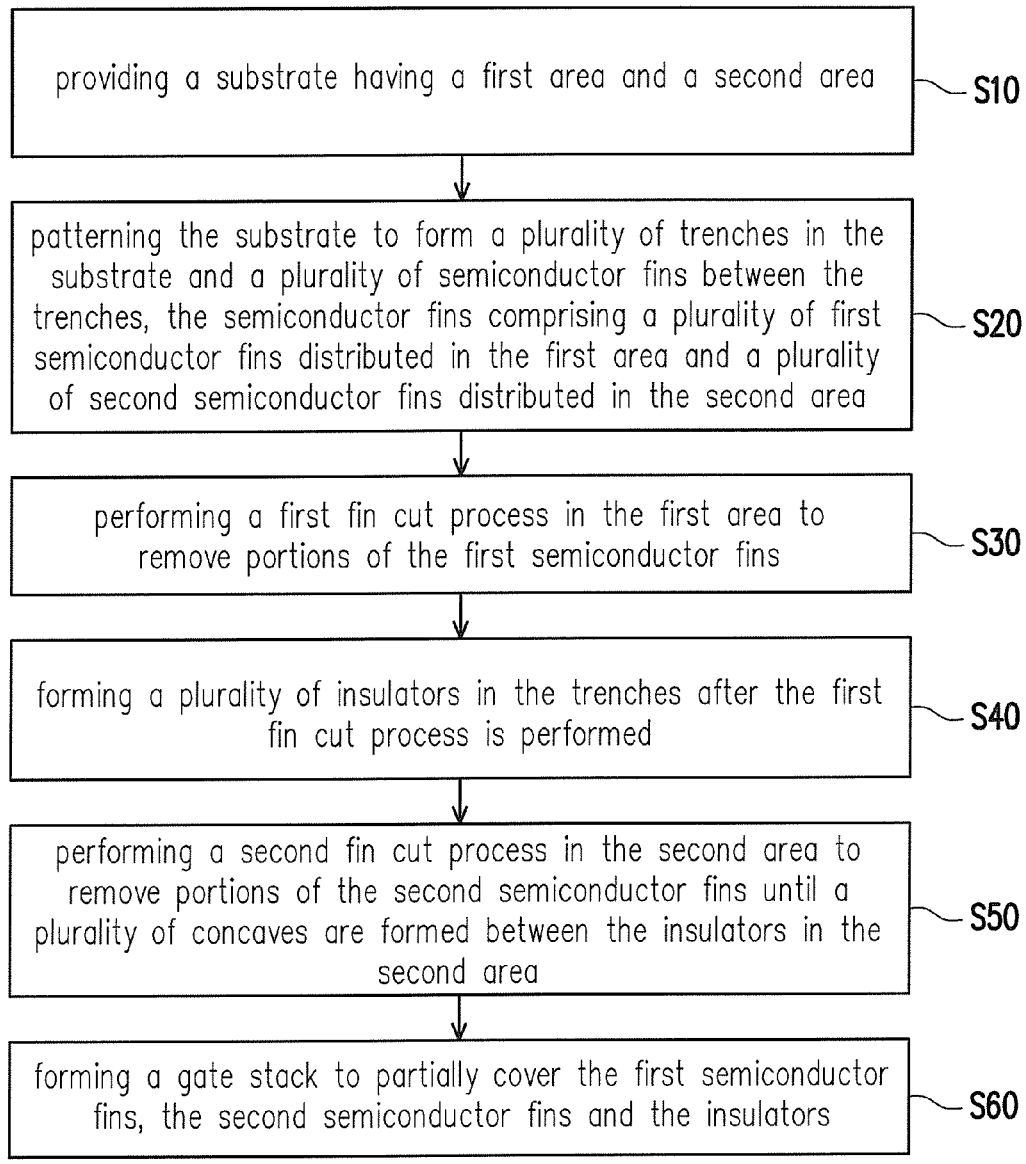
FIG. 1 illustrates a flow chart illustrating a method for fabricating a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be foamed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments of the present disclosure describe the exemplary fabricating process of FinFETs. The FinFETs may be formed on bulk silicon substrates in certain embodiments of the present disclosure. Still, the FinFET may be formed on a silicon-on-insulator (SOI) substrate or a germanium-on-insulator (GOI) substrate as alternatives. Also, in accordance with the embodiments, the silicon substrate may include other conductive layers or other semiconductor elements, such as transistors, diodes or the like. The embodiments are not limited in this context.

FIG. 1 illustrates a flow chart illustrating a method for fabricating a semiconductor device in accordance with some embodiments of the present disclosure. Referring to FIG. 1, the method at least includes step S10, step S20, step S30, step 40, step 50 and step S60. First, in step S10, a substrate having at least one first area (e.g., one or more I/O areas) and at least one second area (e.g., one or more dense areas) is provided. Then, in step S20, the substrate is patterned to form a plurality of trenches in the substrate and a plurality of semiconductor fins between the trenches, wherein the semiconductor fins comprise a plurality of first semiconductor fins distributed in the first area and a plurality of second semiconductor fins distributed in the second area. Then, in step S30, a first fin cut process is performed in the first area to remove portions of the first semiconductor fins. In step S40, a plurality of insulators are formed in the trenches after the first fin cut process is performed. In step S50, a second fin cut process is performed in the second area to remove portions of the second semiconductor fins until a plurality of concaves are formed between the insulators in the second area. Thereafter, in step S60, a gate stack is formed to partially cover the first semiconductor fins, the second semiconductor fins and the insulators. In some embodiments, the above-mentioned dense areas are areas having high circuit integrity or layout density while the above-mentioned I/O areas are areas having low circuit integrity or layout density.

The fabrication of the semiconductor device including FinFETs is described in accompany with FIG. 1, FIGS. 2A-2L, FIGS. 3A-3L, FIGS. 4A-4L and FIGS. 5A-5L. FIGS. 2A-2L are perspective views of a method for fabricating a FinFET distributed in a dense area of a semiconductor device in accordance with some embodiments of the present disclosure; FIGS. 3A-3L are cross-sectional views of a method for fabricating a FinFET distributed in a dense area of a semiconductor device in accordance with some embodiments of the present disclosure; FIGS. 4A-4L are perspective views of a method for fabricating a FinFET distributed in an I/O area of a semiconductor device in accordance with some embodiments of the present disclosure; and FIGS. 5A-5L are cross-sectional views of a method for fabricating a FinFET distributed in an I/O area of a semiconductor device in accordance with some embodiments of the present disclosure.

Figure 2A:
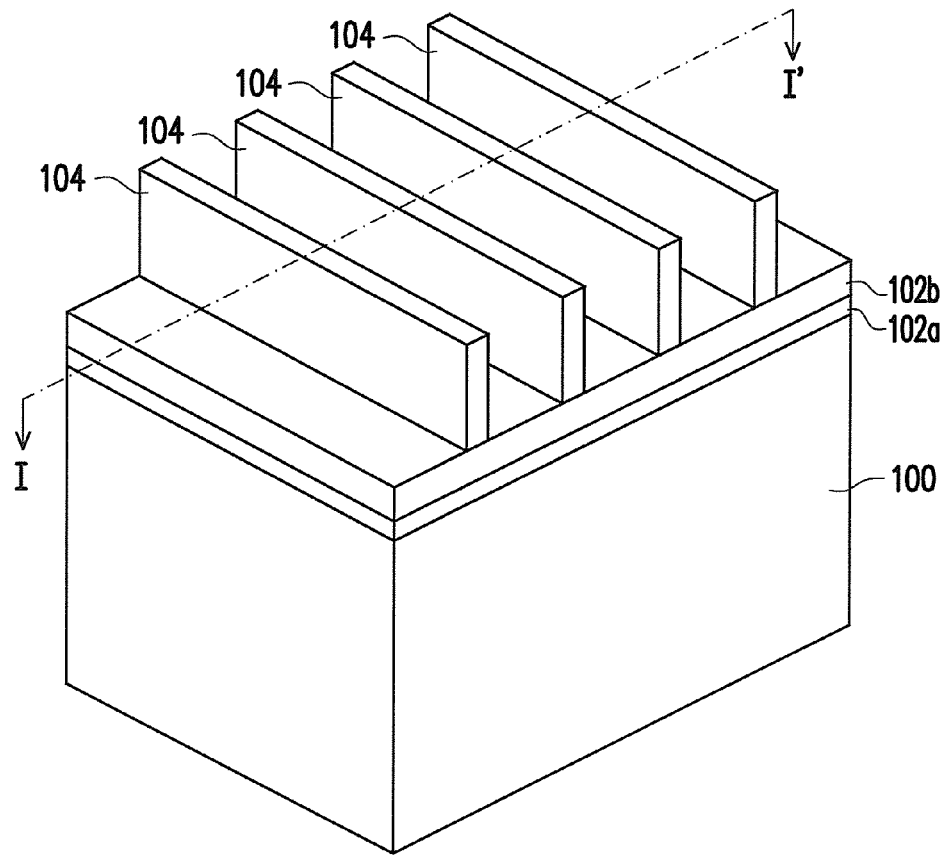
FIGS. 2A-2L are perspective views of a method for fabricating a FinFET distributed in a dense area of a semiconductor device in accordance with some embodiments of the present disclosure.
Figure 3A:
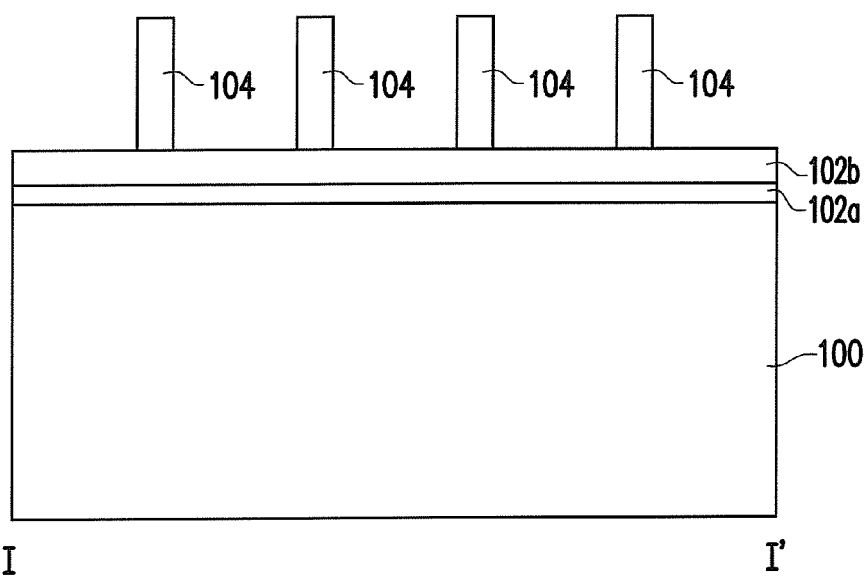
FIGS. 3A-3L are cross-sectional views of a method for fabricating a FinFET distributed in a dense area of a semiconductor device in accordance with some embodiments of the present disclosure.
Figure 3B:
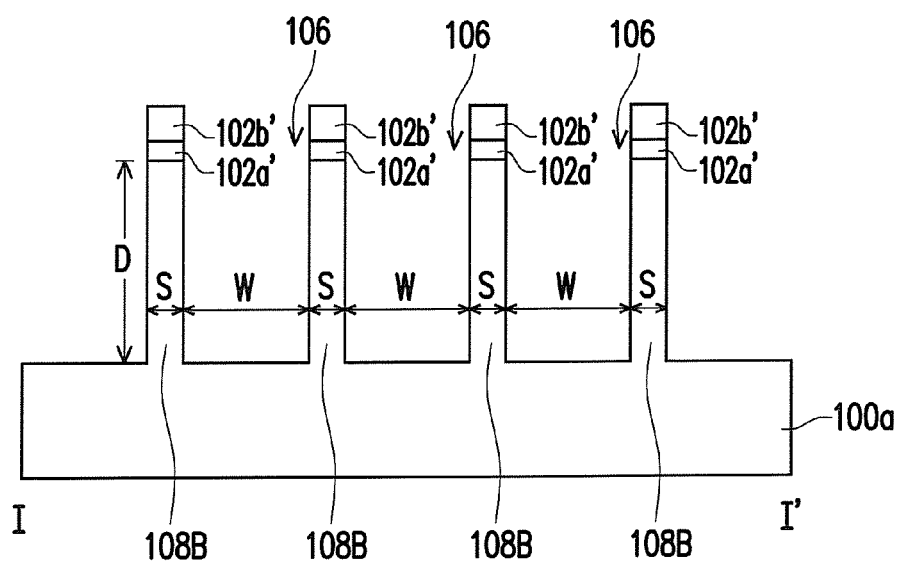
Figure 3C:
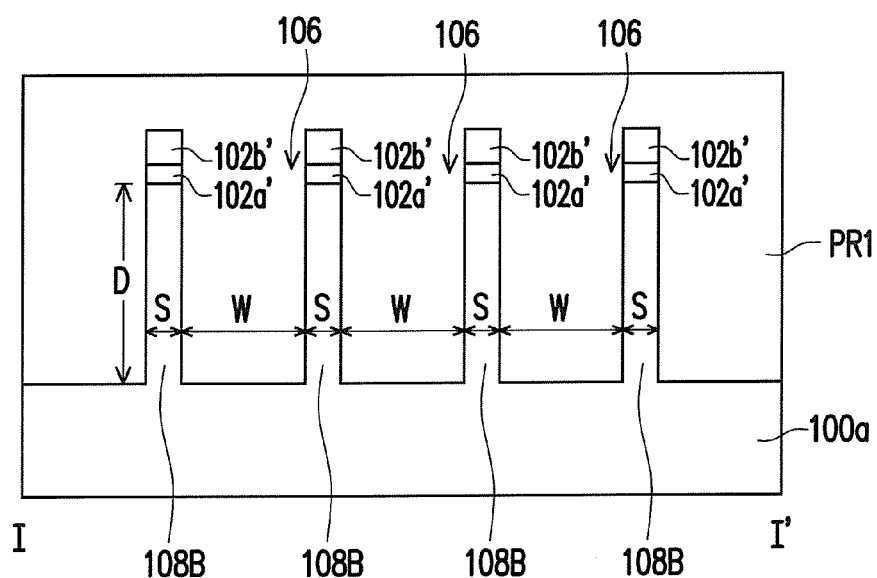
Figure 3D:
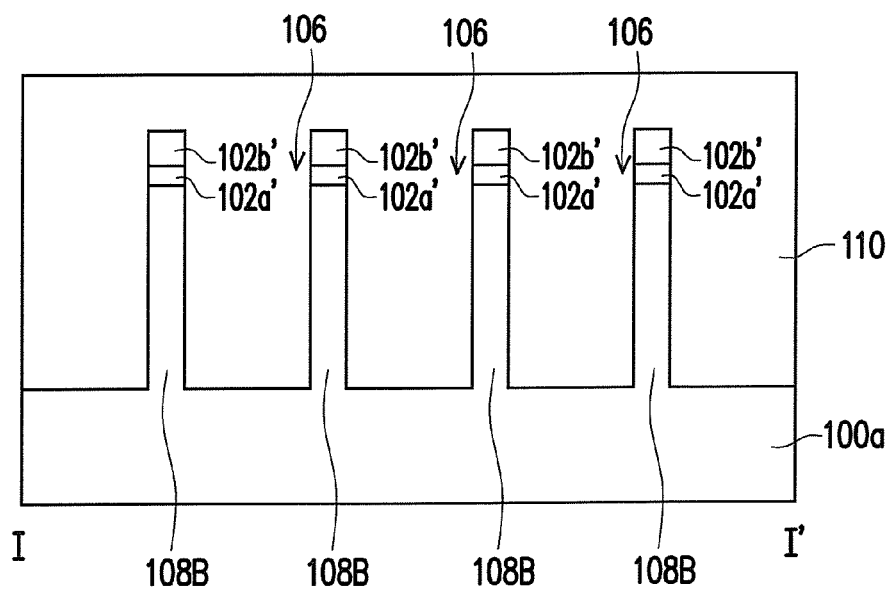
Figure 3E:
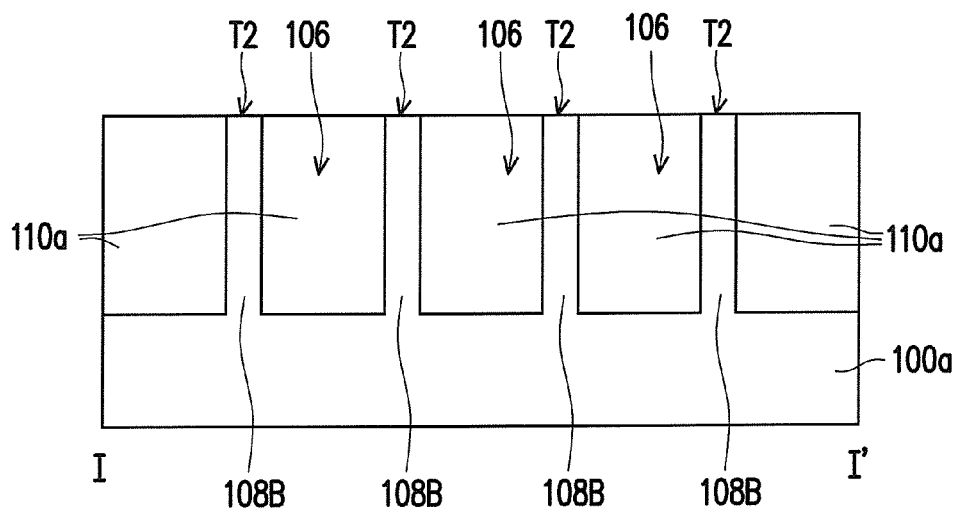
Figure 3F:
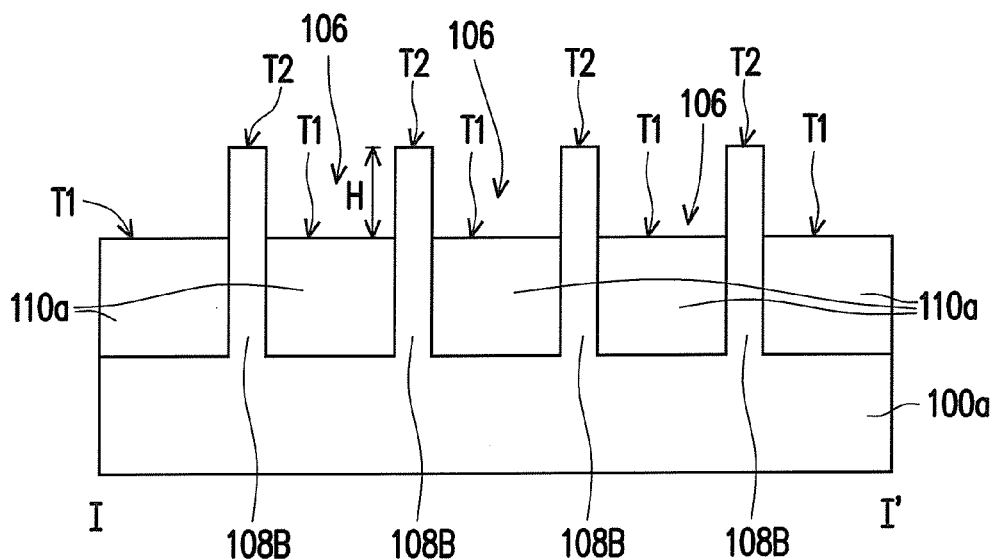
Figure 4A:
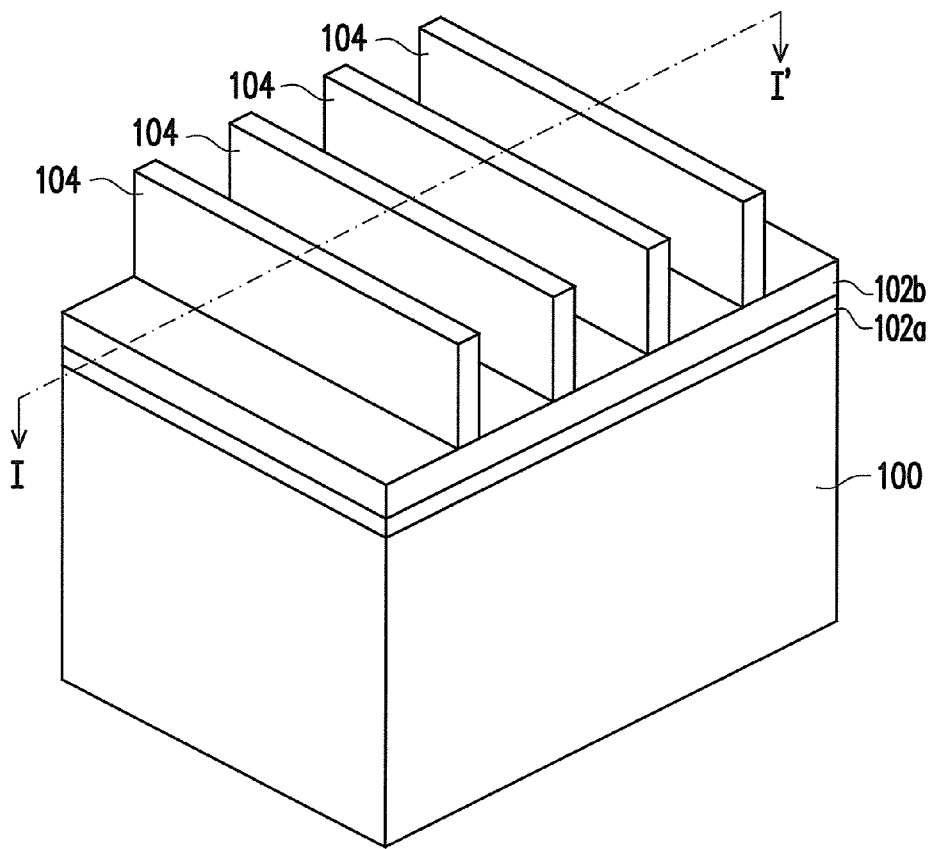
FIGS. 4A-4L are perspective views of a method for fabricating a FinFET distributed in an I/O area of a semiconductor device in accordance with some embodiments of the present disclosure.
Figure 5A:
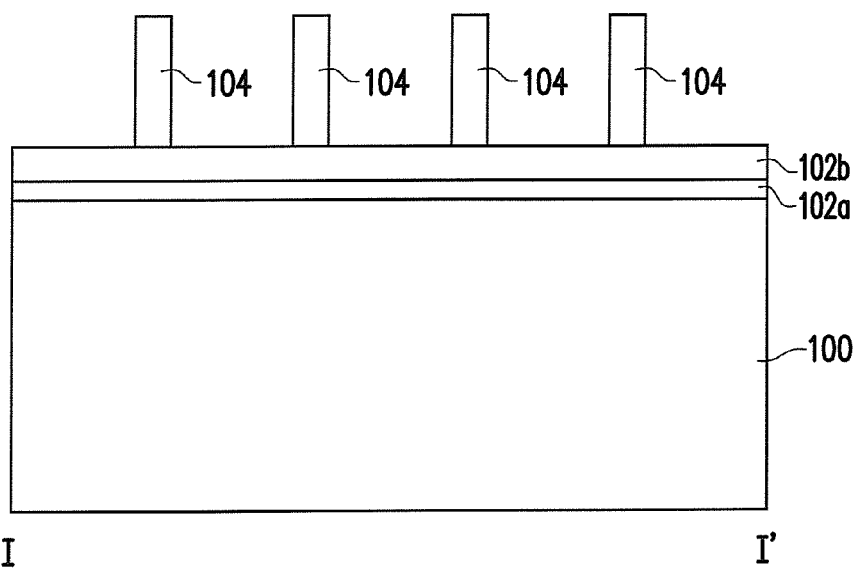
FIGS. 5A-5L are cross-sectional views of a method for fabricating a FinFET distributed in an I/O area of a semiconductor device in accordance with some embodiments of the present disclosure.
Figure 5B:
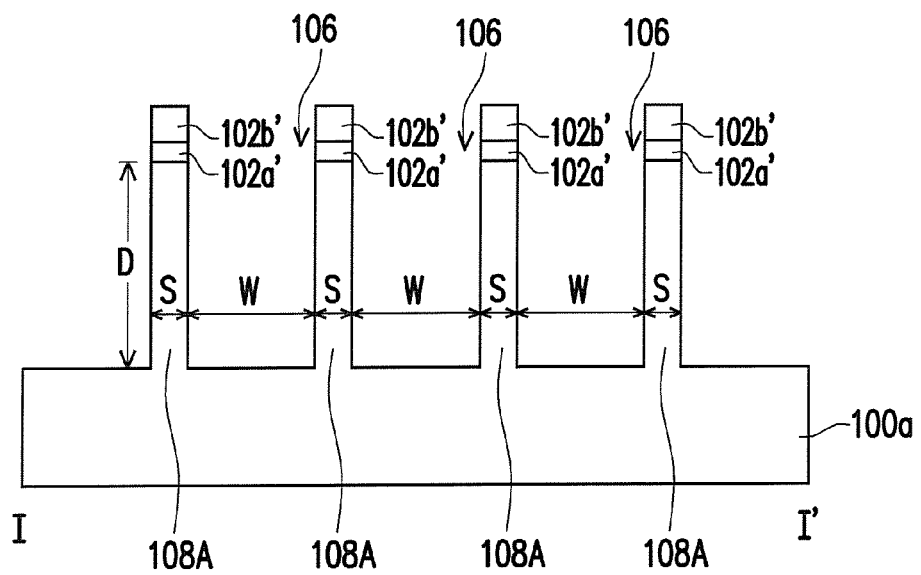
Figure 5C:
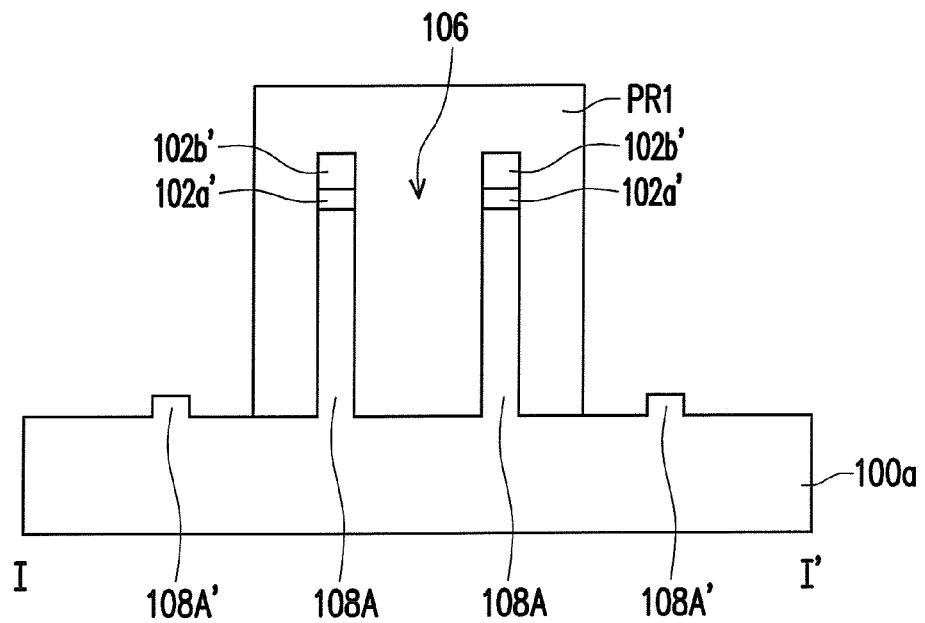
Figure 5D:
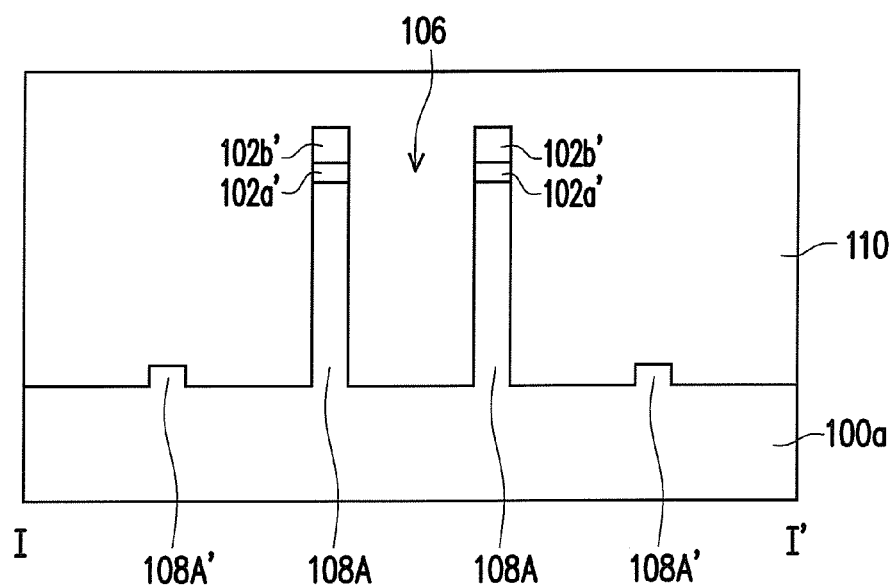
Figure 5E:
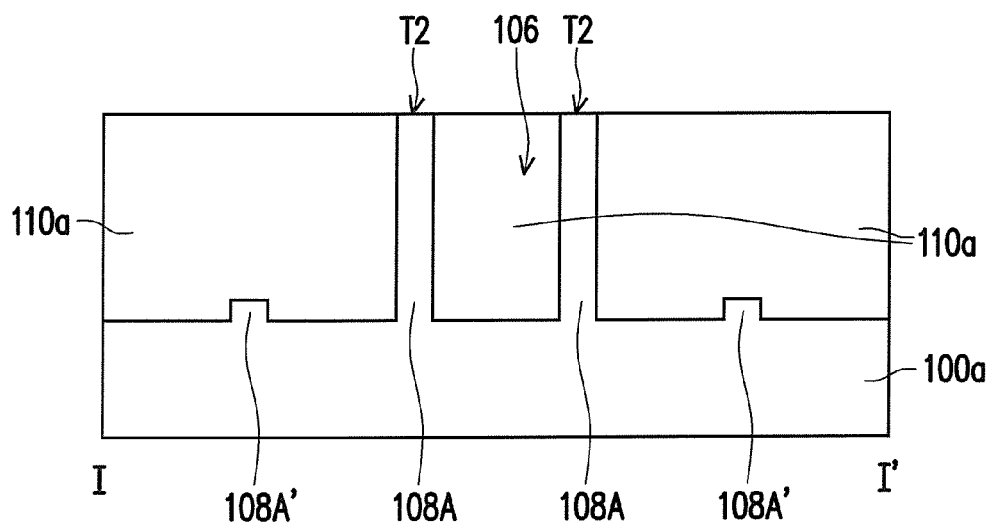

In Step 10 in FIG. 1 and as shown in FIGS. 2A, 3A, 4A and 5A, a substrate 100 having at least one first area (e.g., one or more I/O areas) and at least one second area (e.g., one or more dense areas) is provided. The first area of the substrate 100 is shown in FIG. 4A and FIG. 5A while the second area of the substrate 100 is shown in FIG. 2A and FIG. 3A.

In one embodiment, the substrate 100 comprises a crystalline silicon substrate (e.g., wafer). The substrate 100 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET. In some alternative embodiments, the substrate 100 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

In Step S20 in FIG. 1 and as shown in FIGS. 2A-2B, 3A-3B, 4A-4B and 5A-5B, a protective layer 102a and a hard mask layer 102b are sequentially formed on the first area and the second area of the substrate 100. The protective layer 102a may be a silicon oxide thin film formed, for example, by thermal oxidation process. The protective layer 102a may act as an adhesion layer between the substrate 100 and hard mask layer 102b. The protective layer 102a may also act as an etch stop layer for etching the hard mask layer 102b. In at least one embodiment, the hard mask layer 102b is a silicon nitride layer formed, for example, by low-pressure chemical vapor deposition (LPCVD) or plasma enhanced chemical vapor deposition (PECVD). A patterned photoresist layer 104 having a predetermined pattern is formed on the hard mask layer 102b.

As shown in FIGS. 2B, 3B, 4B and 5B, the hard mask layer 102b and the protective layer 102a which are not covered by the patterned photoresist layer 104 are sequentially etched to form a patterned hard mask layer 102b' and a patterned protective layer 102a' so as to expose underlying substrate 100. By using the patterned hard mask layer 102b', the patterned protective layer 102a' and the patterned photoresist layer 104 as a mask, portions of the substrate 100 are exposed and etched to obtain a semiconductor substrate 100a having trenches 106, a plurality of first semiconductor fins 108A (shown in FIGS. 4B-5B) distributed in the first area and a plurality of second semiconductor fins 108B (shown in FIGS. 2B-3B) distributed in the second area. The first and second semiconductor fins 108A, 108B are substantially parallel to each other, for example. The number of the first semiconductor fins 108A shown in FIGS. 2B-3B and the second semiconductor fins 108B shown in FIGS. 4B-5B is merely for illustration. In some alternative embodiments, at least one semiconductor fin 108A, 108B (e.g., one, two, three or more than four) may be formed in accordance with actual design requirements. After the trenches 106 are formed, the first and second semiconductor fins 108A, 108B are covered by the patterned hard mask layer 102b', the patterned protective layer 102a' and the patterned photoresist layer 104. Two adjacent trenches 106 are spaced apart by a spacing S. For example, the spacing S between two adjacent trenches 106 may be smaller than about 30 nm. In other words, two adjacent trenches 106 in the first area are spaced apart by one of the first semiconductor fins 108A while two adjacent trenches 106 in the second area are spaced apart by the second semiconductor fins 108B. The width of the first semiconductor fins 108A and the width of the second semiconductor fins 108B are substantially the same with the spacing S.

In some embodiments, the width W of the trenches 106 ranges from about 20 nm to about 48 nm. The height of the first and second semiconductor fins 108A, 108B and the depth D of the trenches 106 range from about 40 nm to about 70 nm, for example. After the trenches 106, the first semiconductor fins 108A and the second semiconductor fins 108B are formed, the patterned photoresist layer 104 is removed. In one embodiment, a cleaning process may be performed to remove a native oxide of the semiconductor substrate 100a having the first and second semiconductor fins 108A, 108B formed thereon. The cleaning process may be performed using diluted hydrofluoric (DHF) acid or other suitable cleaning solutions.

In Step S30 in FIG. 1 and as shown in FIGS. 2B-2C, 3B-3C, 4B-4C and 5B-5C, after the trenches 106, the first semiconductor fins 108A and the second semiconductor fins 108B are formed, a first fin cut process is performed in the first area to remove unwanted portions of the first semiconductor fins 108A. For example, the first fin cut process is performed by photolithograph and etching processes. The Details of the first fin cut process is illustrated as followings.

A first patterned photoresist layer PR1 is formed on the substrate 100a such that the first semiconductor fins 108A in the first area are partially covered by the first patterned photoresist layer PR1. The first patterned photoresist layer PR1 further covers the second semiconductor fins 108A in the second area. Then, portions of the first semiconductor fins 108A uncovered by the first patterned photoresist layer PR1 are removed such that a plurality of first semiconductor portions 108A' are formed or remain on the substrate 100a. For example, the portions of the first semiconductor fins 108A uncovered by the first patterned photoresist layer PR1 are removed by an etching process. In some alternative embodiments, the portions of the first semiconductor fins 108A uncovered by the first patterned photoresist layer PR1 may be removed thoroughly via proper process control. In other words, the first semiconductor portions 108A' on the substrate 100a are formed optionally. During the first fin cut process, the second semiconductor fins 108B are protected by the first patterned photoresist layer PR1. After the unwanted portions of the first semiconductor fins 108A are removed, the first patterned photoresist layer PR1.

In Step S40 in FIG. 1 and as shown in FIGS. 2C-2D, 3C-3D, 4C-4D and 5C-5D, after the first fin cut process is performed, a dielectric layer 110 is then formed over the substrate 100a. The dielectric layer 110 fills the trenches 106 and covers the first semiconductor portions 108A', the first semiconductor fins 108A and the second semiconductor fins 108B. In addition to the first semiconductor portions 108A', the first semiconductor fins 108A and the second semiconductor fins 108B, the dielectric layer 110 further covers the patterned pad layer 102a' and the patterned hard mask layer 102b'. The dielectric layer 110 may include silicon oxide, silicon nitride, silicon oxynitride, a spin-on dielectric material, or a low-K dielectric material. The dielectric layer 110 may be formed by high-density-plasma chemical vapor deposition (HDP-CVD), sub-atmospheric CVD (SACVD) or by spin-on. In some alternative embodiments, the dielectric layer 110 is a flowable dielectric layer formed by chemical vapor deposition (CVD) process and curing process.

In Step S40 in FIG. 1 and as shown in FIGS. 2D-2E, 3D-3E, 4D-4E and 5D-5E, a planarization process, such as chemical mechanical polish (CMP) process is, for example, performed to remove a portion of the dielectric layer 110 that is outside the trenches 106, the patterned hard mask layer 102b' and the patterned protective layer 102a' until the top surfaces T2 of the first and second semiconductor fins 108A, 108B are exposed. As shown in FIGS. 2E, 3E, 4E and 5E, after the dielectric layer 110 is polished, top surfaces of the polished dielectric layer 110 is substantially aligned or coplanar with the top surfaces T2 of the first and second semiconductor fins 108A, 108B.

In Step S40 in FIG. 1 and as shown in FIGS. 2E-2F, 3E-3F, 4E-4F and 5E-5F, after the dielectric layer 110 outside the trenches 106 is removed, the remaining dielectric layer 110 in the trenches 106 are partially removed by an etching process such that insulators 110a (e.g., STI structure) are formed in the trenches 106 and partially cover sidewalls of the first and second semiconductor fin 108A, 108B. In some embodiments, the etching process may be a wet etching process with hydrofluoric acid (HF) or a dry etching process.

Figure 4B:
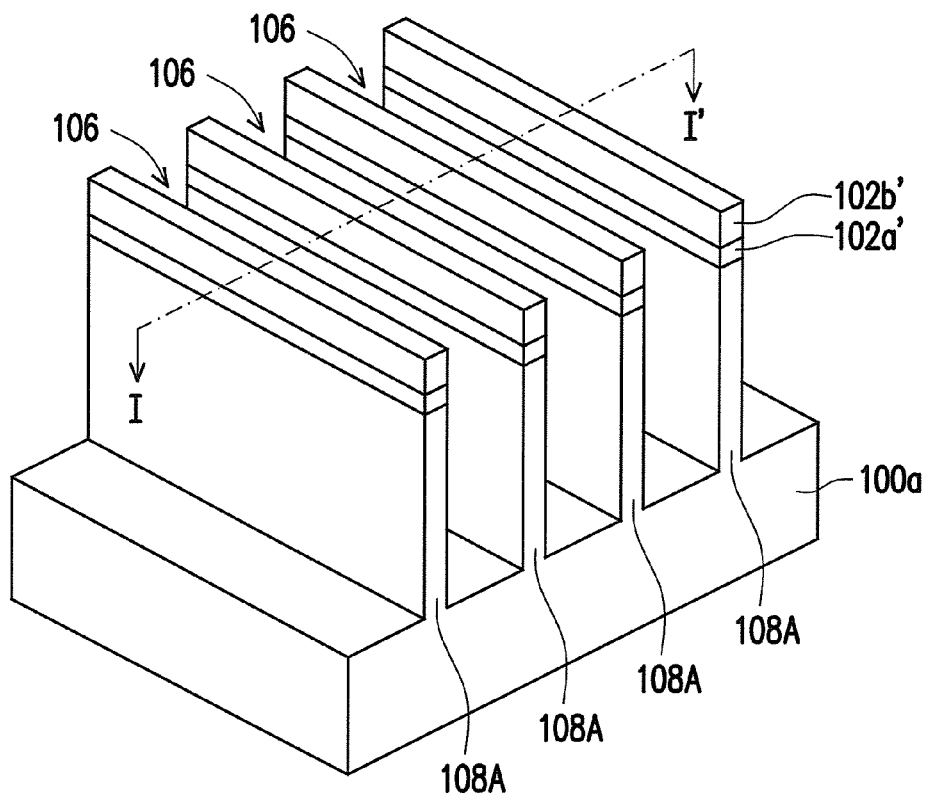
Figure 4C:
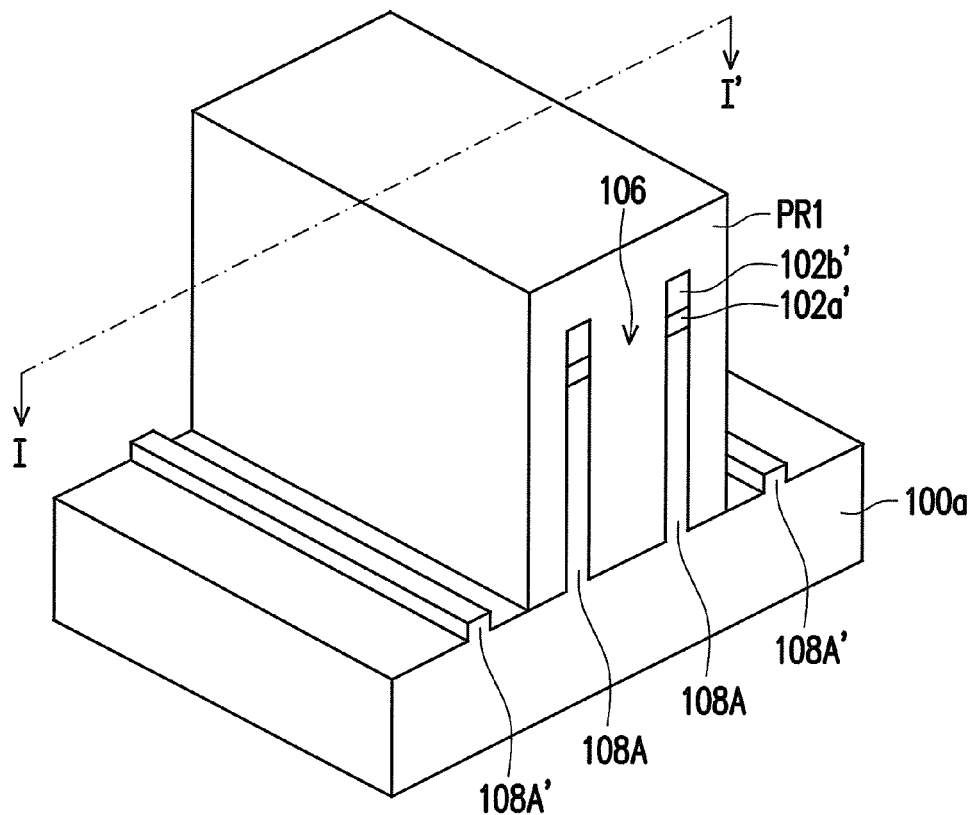
Figure 4D:
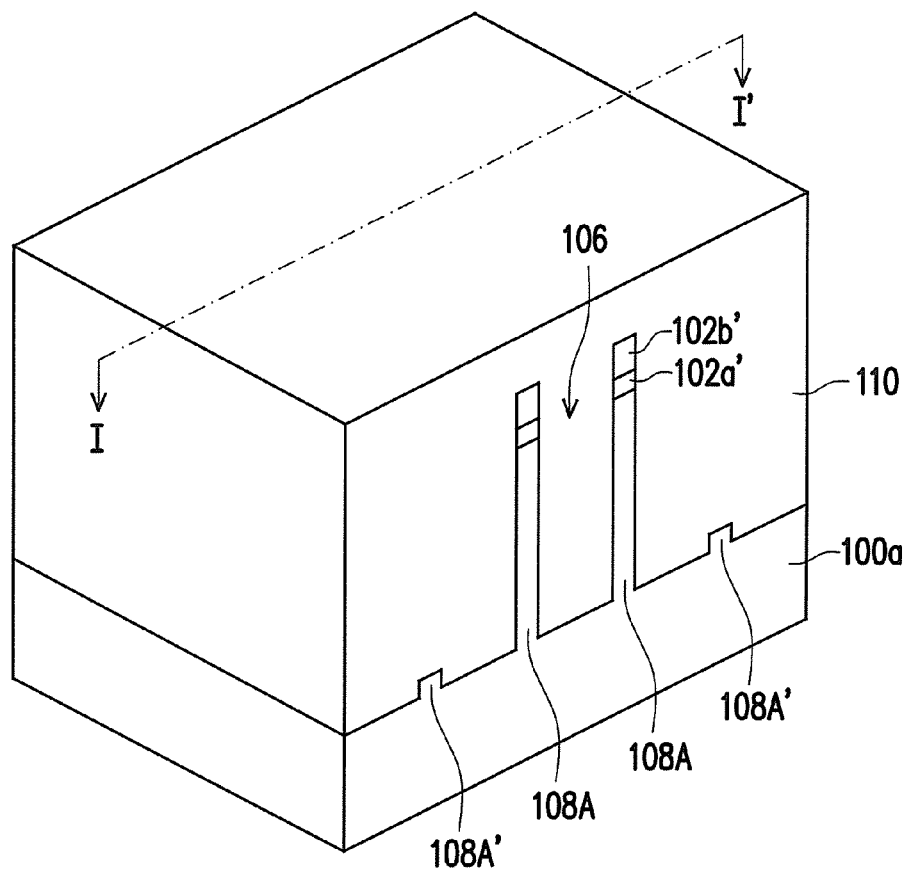
Figure 4E:
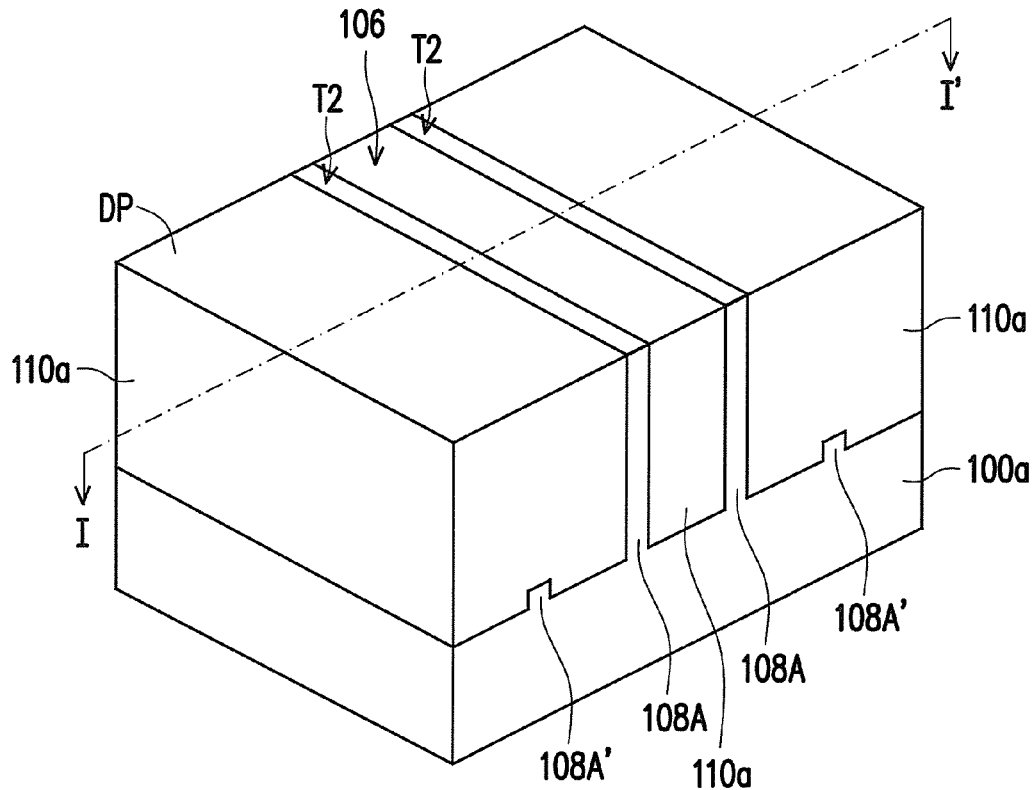
Figure 4F:
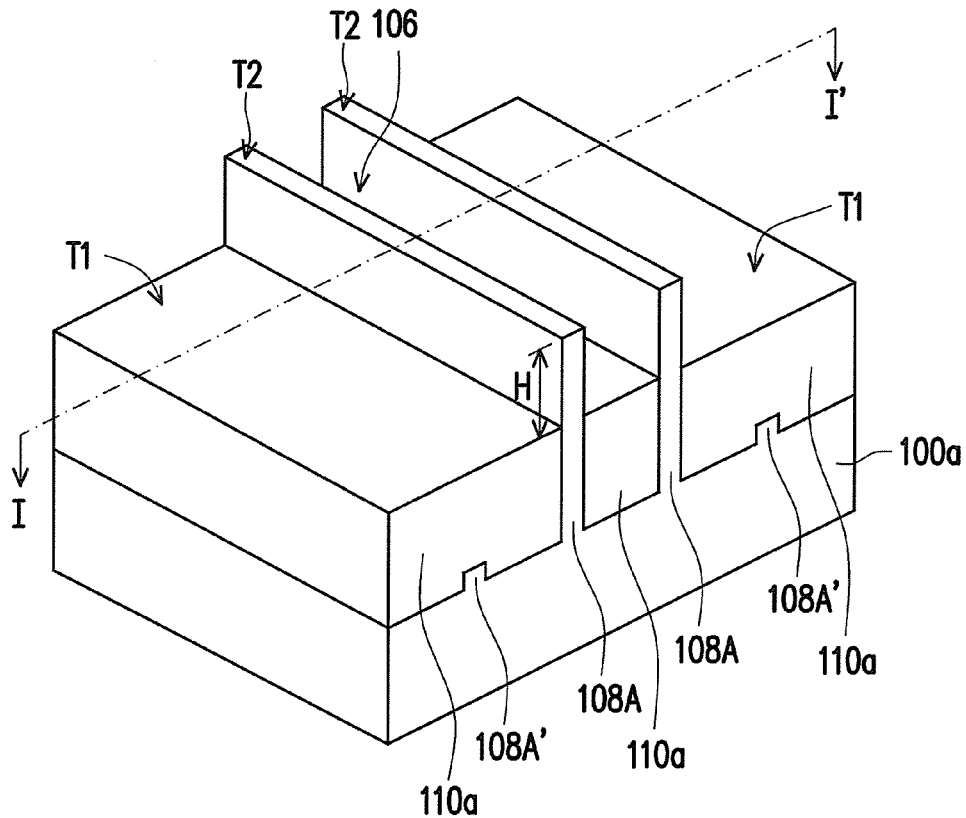
Figure 5F:
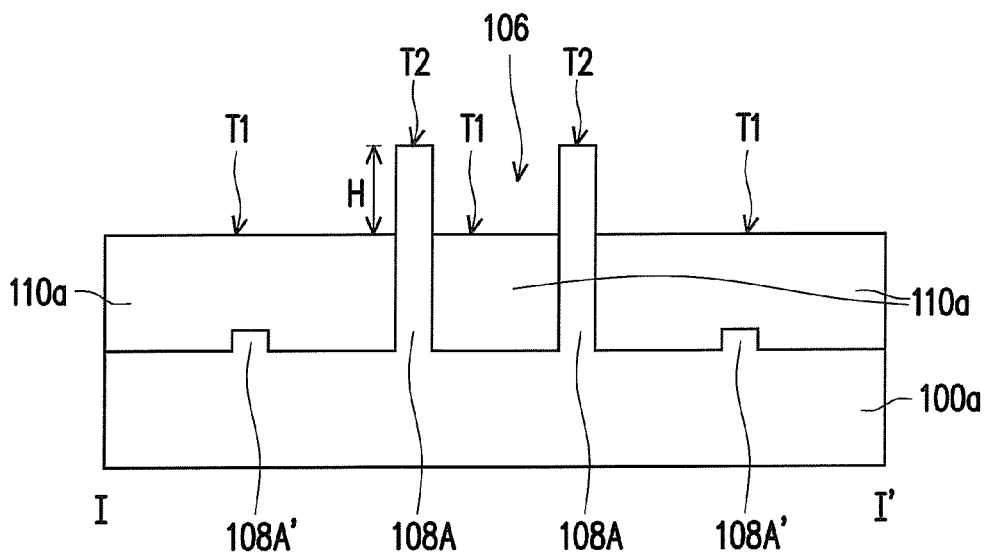
Figure 5G:
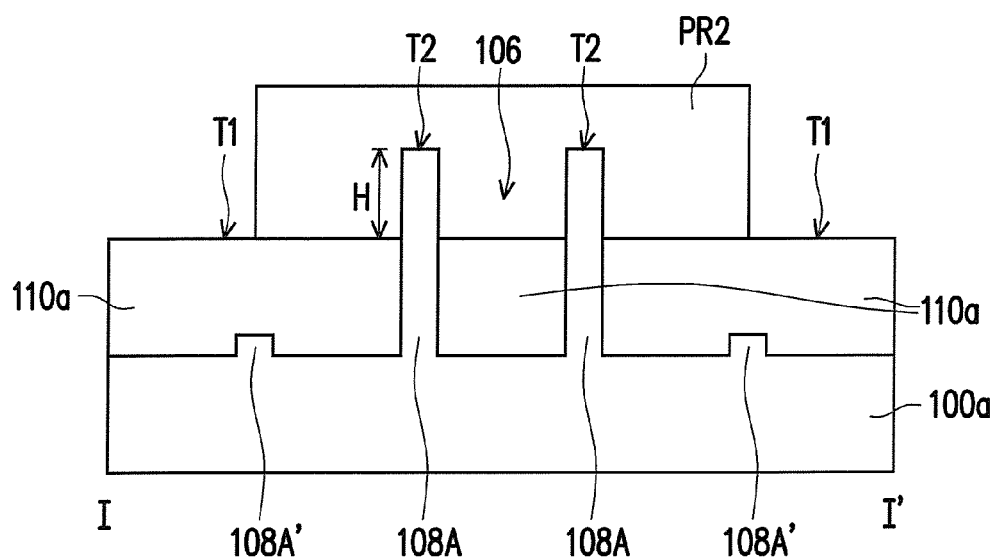
Figure 5H:
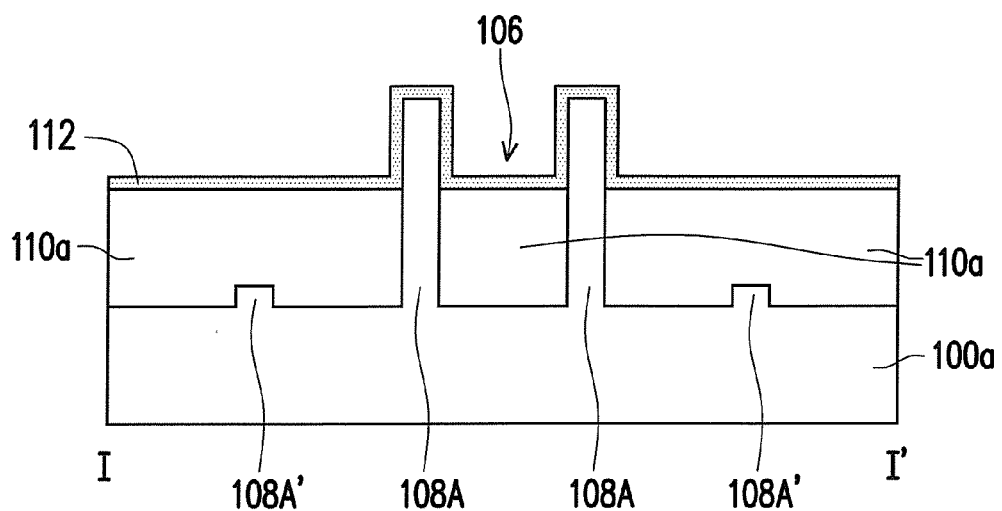

As shown in FIGS. 2F, 3F, 4F and 5F, the top surfaces T1 of the insulators 110a are lower than the top surfaces T2 of the first and second semiconductor fins 108A, 108B. The first and second semiconductor fins 108A, 108B protrude from the top surfaces T1 of the insulators 110a. The height difference H (i.e. fin height) between the top surfaces T2 of the first and second semiconductor fins 108A, 108B and the top surfaces T1 of the insulators 110a ranges from about 15 nm to about 50 nm, for example. Furthermore, the first semiconductor portions 108A' are covered by the insulators 110a, as shown in FIG. 4F and FIG. 5F.

In Step S50 in FIG. 1 and as shown in FIGS. 2F-2G, 3F-3G, 4F-4G and 5F-5G, a second fin cut process is performed to remove unwanted portions of the second semiconductor fins 108B until a plurality of concaves 111 are formed between the insulators 110a in the second area. For example, the second fin cut process is performed by photolithograph and etching processes. The Details of the second fin cut process is illustrated as followings.

A second patterned photoresist layer PR2 is formed on the top surfaces T1 of the insulators 110a such that the wanted portions of the second semiconductor fins 108B are partially covered thereby. In other words, the unwanted portions of the second semiconductor fins 108B are not covered and are exposed by the second patterned photoresist layer PR2. The second patterned photoresist layer PR2 further covers the first semiconductor fins 108A in the first area. Then, portions of the second semiconductor fins 108B uncovered by the second patterned photoresist layer PR2 are removed such that a plurality of second semiconductor portions 108B' are formed or remain on the substrate 100a. Since the second patterned photoresist layer PR2 is formed on the top surfaces T1 of the insulators 110a, the second semiconductor fins 108B distributed in the second area (e.g., core area) of a semiconductor device can be easily covered and protected by the second patterned photoresist layer PR2. In other words, upper portions of the second semiconductor fins 108B are protected by the second patterned photoresist layer PR2 while lower portions of the second semiconductor fins 108B are protected by insulators 110a. When the second patterned photoresist layer PR2 is formed to cover the second semiconductor fins 108B distributed in the second area (e.g., core area) of the semiconductor device, it is easy to meet the thickness requirement (i.e. sufficient thick) of the second patterned photoresist layer PR2 because the lower portions of the second semiconductor fins 108B are protected by insulators 110a. Similarly, the second patterned photoresist layer PR2 protects the first semiconductor fins 108A distributed in the first area (e.g., I/O area) of the semiconductor device well.

After the second patterned photoresist layer PR2 is formed over the insulators 110a, the unwanted portions of the second semiconductor fins 108B uncovered by the second patterned photoresist layer PR2 are removed until the concaves 111 are formed between the insulators 110a in the second area. The removal of the unwanted portions of the second semiconductor fins 108B is a self-aligned process and process window of formation of the second patterned photoresist layer PR2 is large. In some embodiments, the unwanted portions of the second semiconductor fins 108B are etched by using the second patterned photoresist layer PR2 as an etching mask. During the removal of the unwanted portions of the second semiconductor fins 108B, the unwanted portions of the second semiconductor fins 108B is, for example, etched by an etchant (e.g., HBr, He, $Cl_2$, $NF_3$, $O_2$, $SF_6$, $CF_4$, $CH_3F$, $CH_2F_2$, $CH_xF_y$, $N_2$, $SO_2$, Ar and so on) effectively and the etchant does not damage the insulators 110a significantly. In some embodiments, the above-mentioned etching process for removing the unwanted portions of the second semiconductor fins 108B may be a wet etching process or a dry etching process.

The number of the concaves 111 is merely for illustration, in some alternative embodiments, one concave or more than two concaves may be formed in accordance with actual design requirements.

As shown in FIGS. 2G, 3G, 4G and 5G, after the unwanted portions of the second semiconductor fins 108B are removed, a plurality of second semiconductor portions 108B' remain in the concaves 111. In some embodiments, the second semiconductor portions 108B' may include curved surfaces CS on top thereof and the curved surfaces CS are exposed by the concaves 111. The curved surfaces CS are lower than the top surfaces T1 of the insulators 110a. For example, the second semiconductor portions 108B' are protrusions located at bottom of the concaves 111. Furthermore, the curved surfaces CS are sunken surfaces, for example.

Figure 2B:
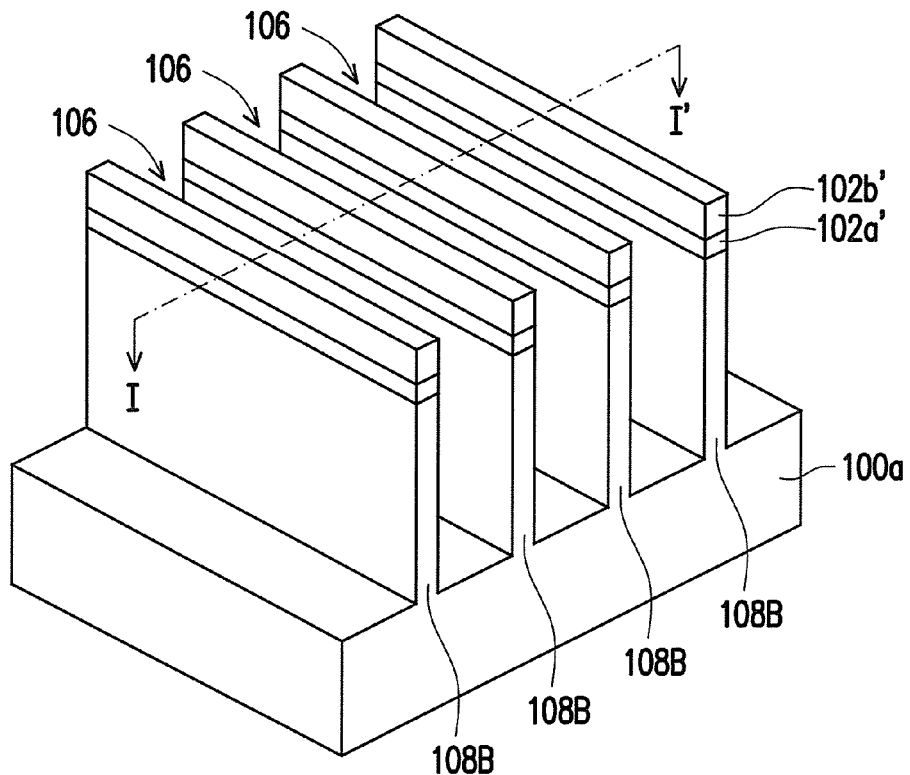
Figure 2C:
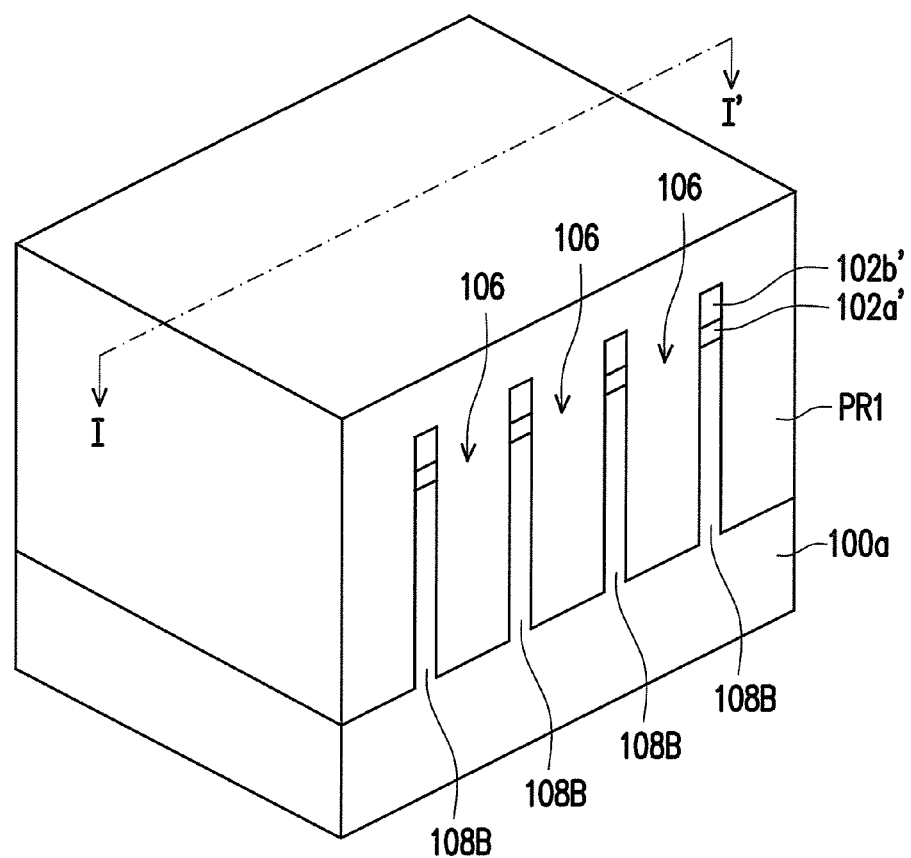
Figure 2D:
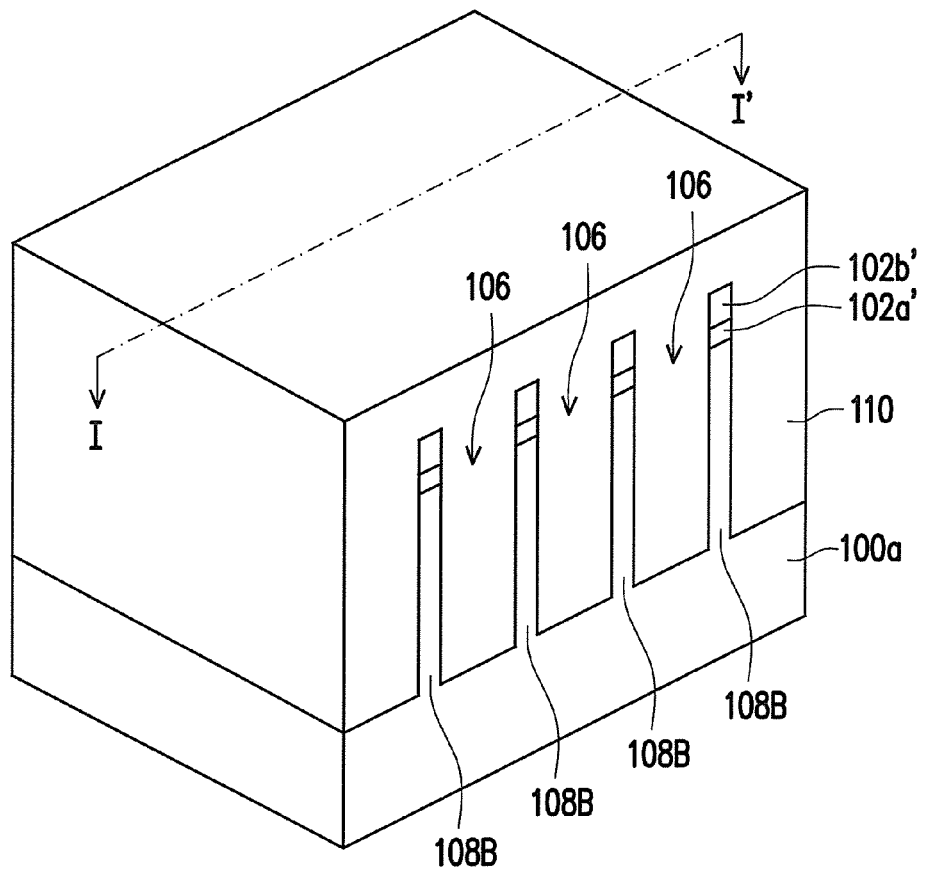
Figure 2E:
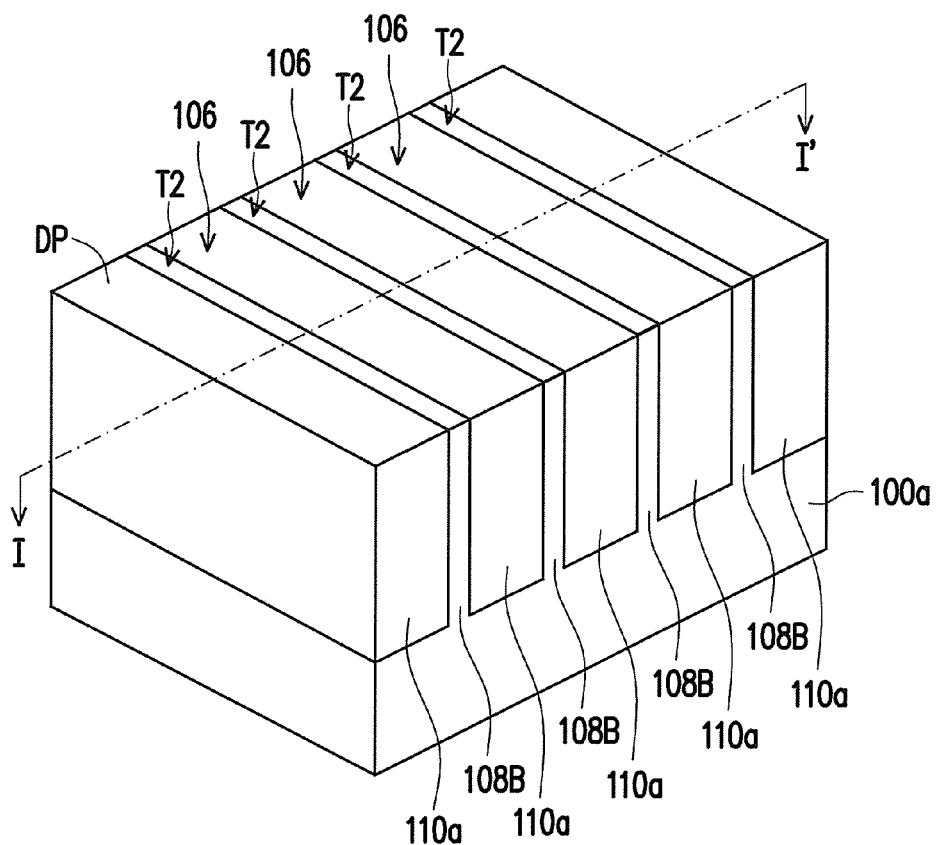
Figure 2F:
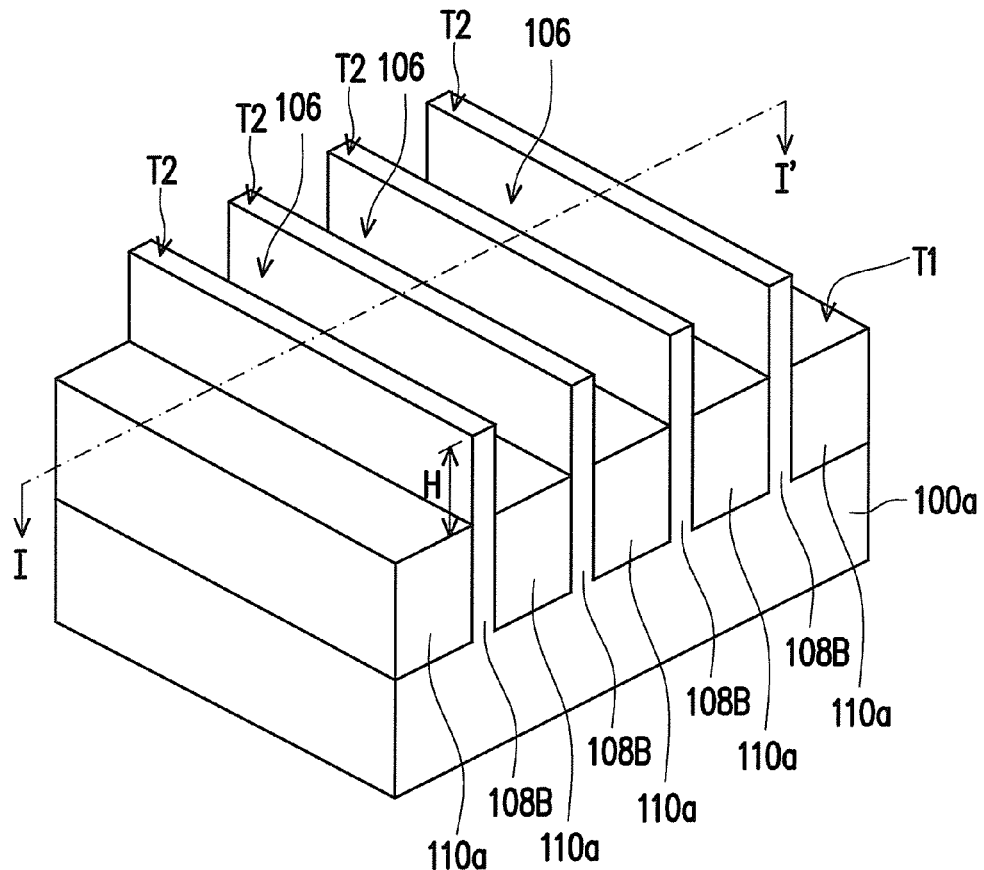
Figure 2G:
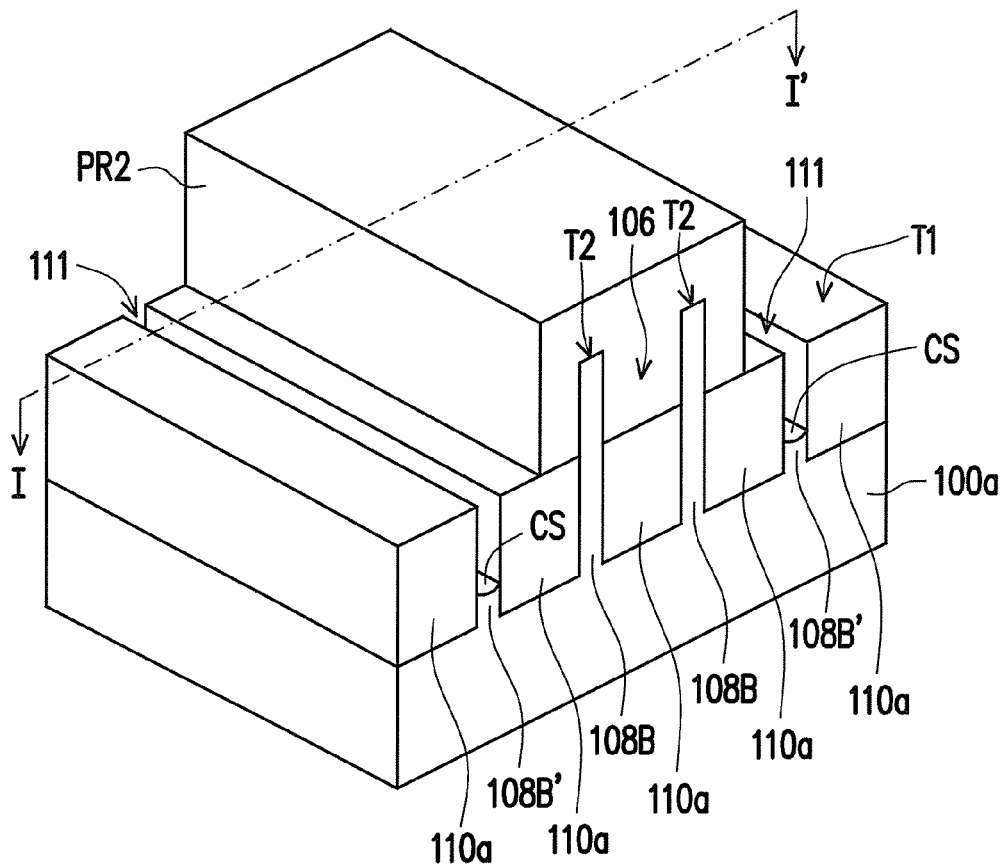
Figure 3G:
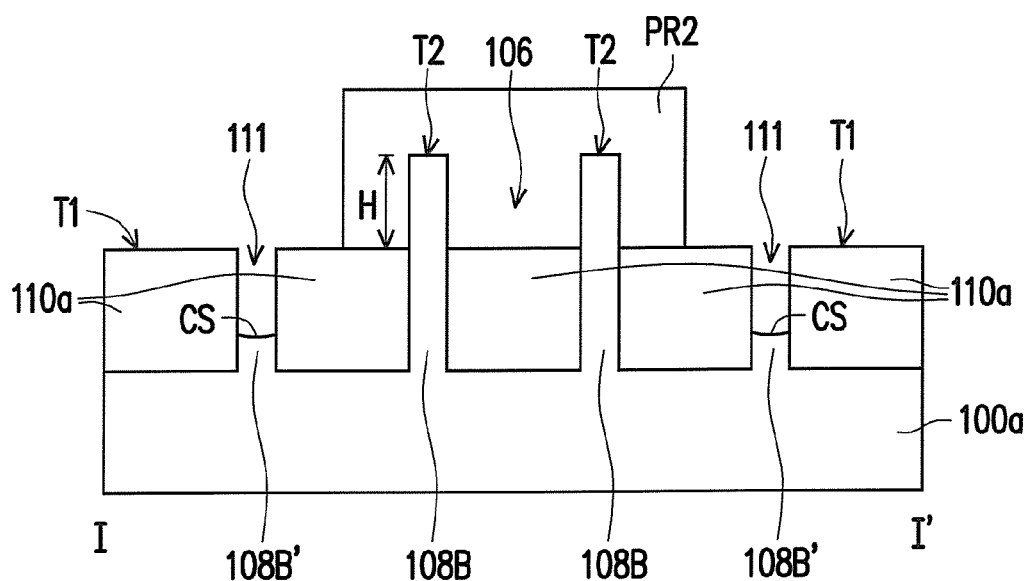
Figure 3G:
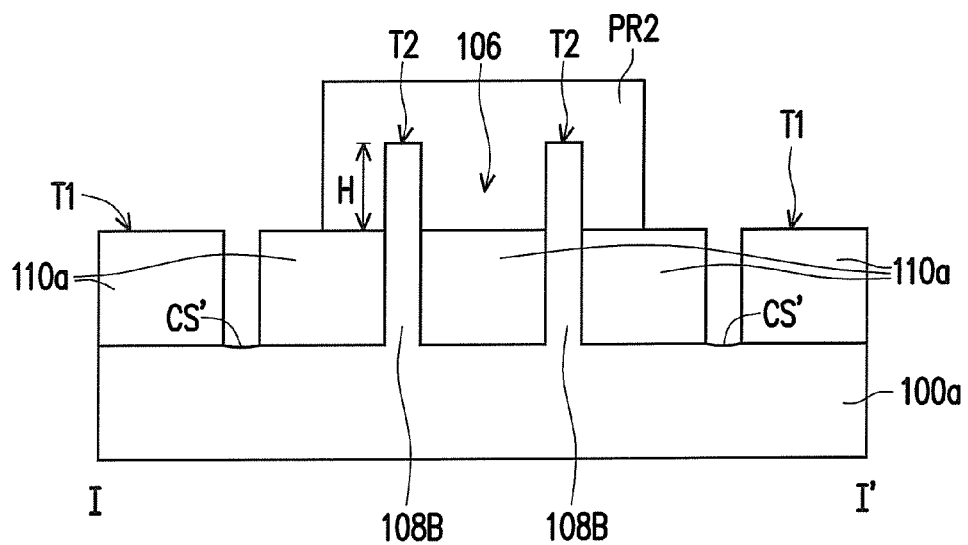

In some alternative embodiments, as shown in FIG. 2G' and FIG. 3G', the unwanted portions of the second semiconductor fins 108B may be removed (e.g., etched-off) until a plurality of curved surfaces CS' of the substrate 100a are formed and exposed by the concaves 111. The curved surfaces CS' are lower than the bottom surfaces of the insulators 110a. In other words, no semiconductor portion or protrusion remains in the concaves 111. For example, the curved surfaces CS' are sunken surfaces.

After the unwanted portions of the second semiconductor fins 108B are removed, the second patterned photoresist layer PR2 shown in FIGS. 2G, 3G, 4G and 5G is removed.

In Step S60 in FIG. 1 and as shown in FIGS. 2H-2L, 3H-3L, 4H-4L and 5H-5L, gate stacks GS (shown in FIG. 2L and FIG. 4L) are then formed so as to partially cover the first semiconductor fins 108A, the second semiconductor fins 108B and the insulators 110a.

In Steps S60 in FIG. 1 and as shown in FIGS. 2H, 3H, 4H and 5H, a gate dielectric layer 112 is formed to fill the concaves 111 and to cover the first semiconductor fins 108A, the second semiconductor fins 108B and the insulators 110a. In other words, the concaves 111 between the insulators 110a in the second area are filled by the gate dielectric layer 112 and the semiconductor portion 108B'. The gate dielectric layer 112 filled between the insulators 110a in the second area provides good insulation characteristics and structural strength. In some embodiments, the thickness of the gate dielectric layer 112 is in the range of about 1 nm to about 50 nm. The gate dielectric layer 112 may include silicon oxide, silicon nitride, silicon oxy-nitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. The gate dielectric layer 112 may be formed by a suitable process such as atomic layer deposition (ALD), chemical vapor deposition (CVD), physical vapor deposition (PVD), thermal oxidation, UV-ozone oxidation, or the like.

Figure 2G:
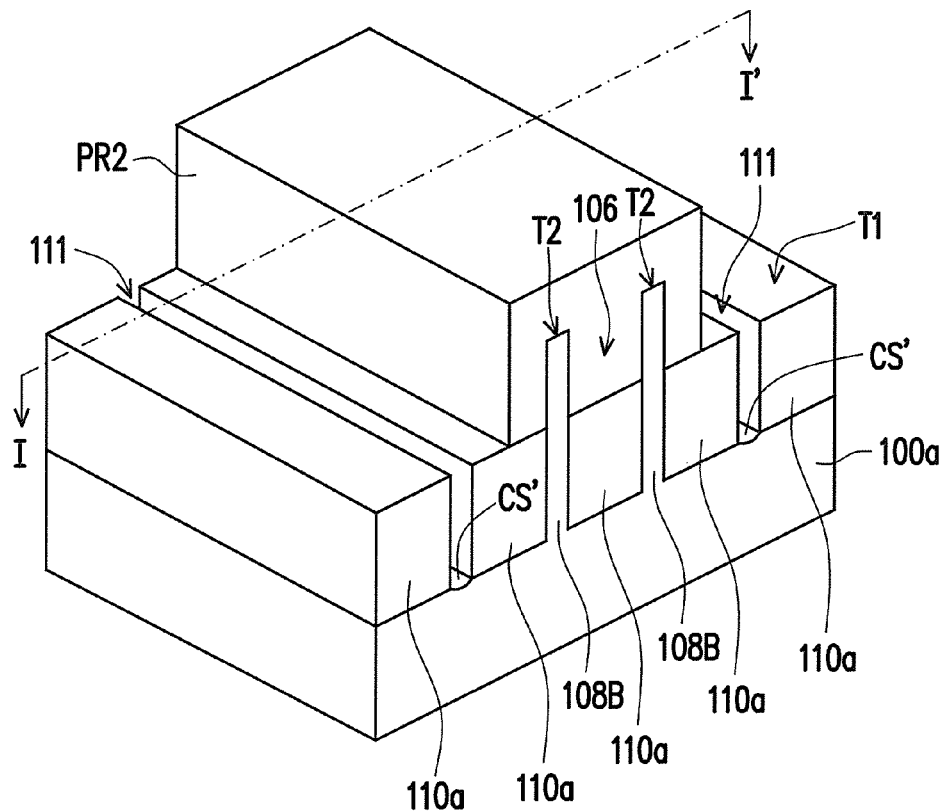
Figure 2H:
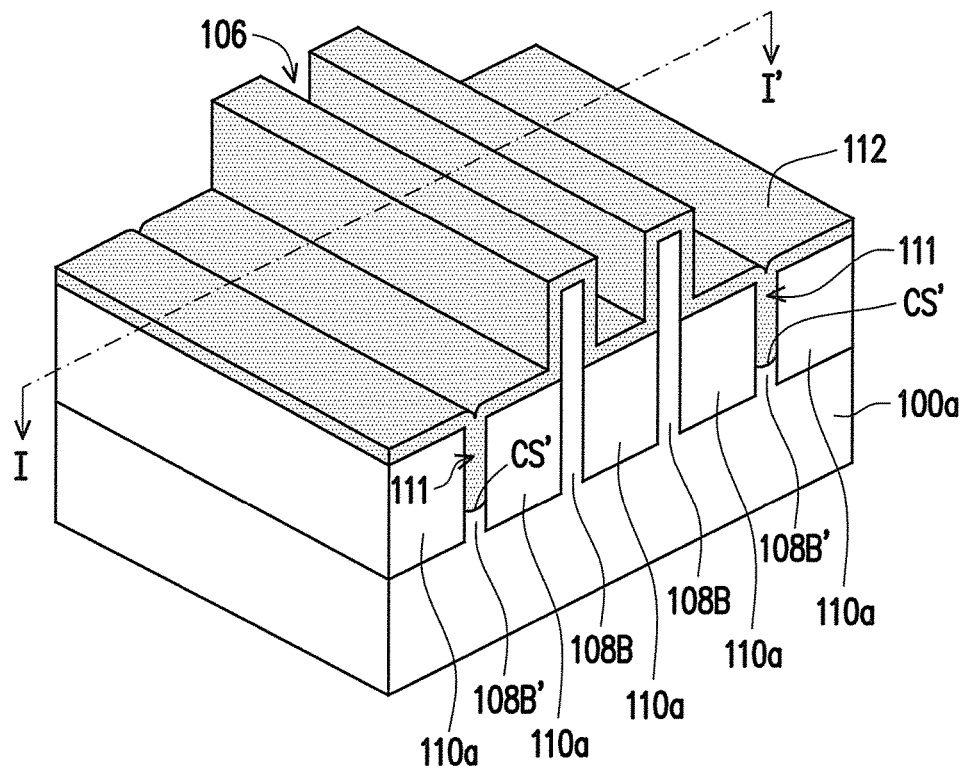
Figure 3H:
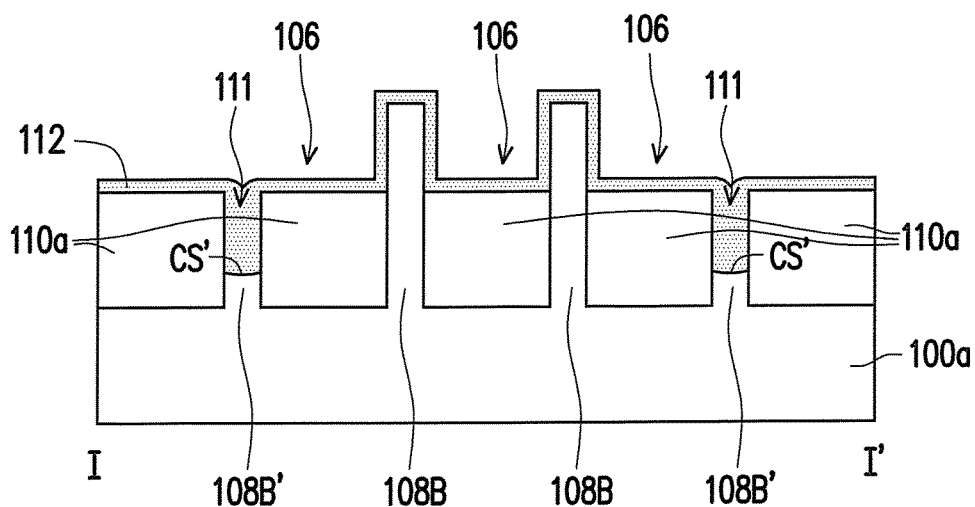
Figure 2H:
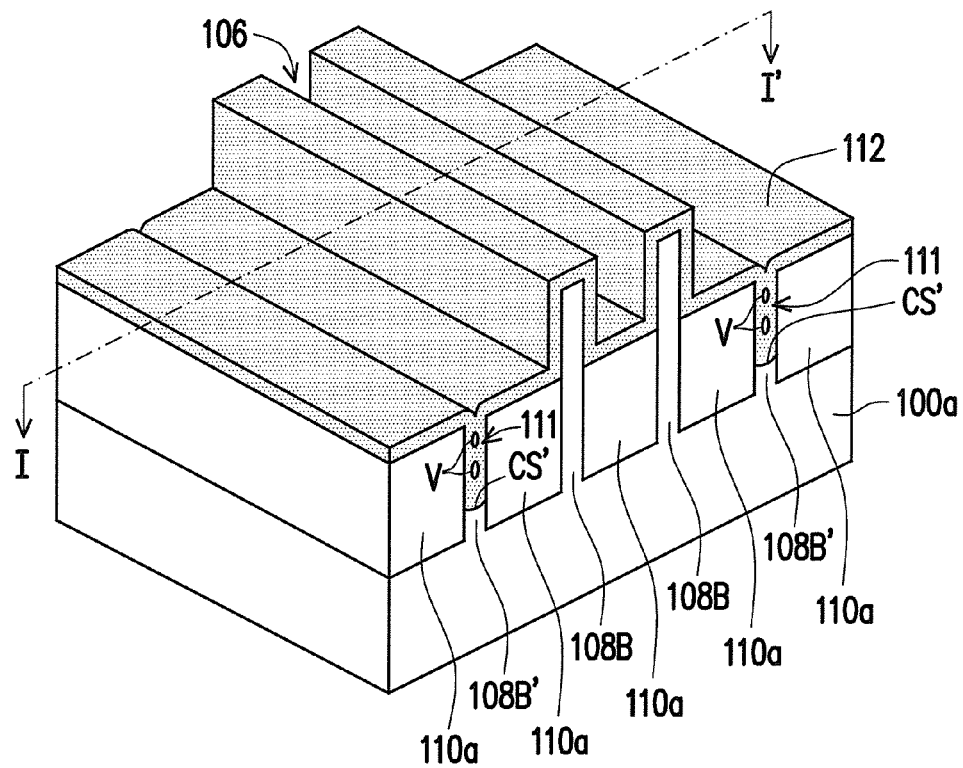
Figure 3H:
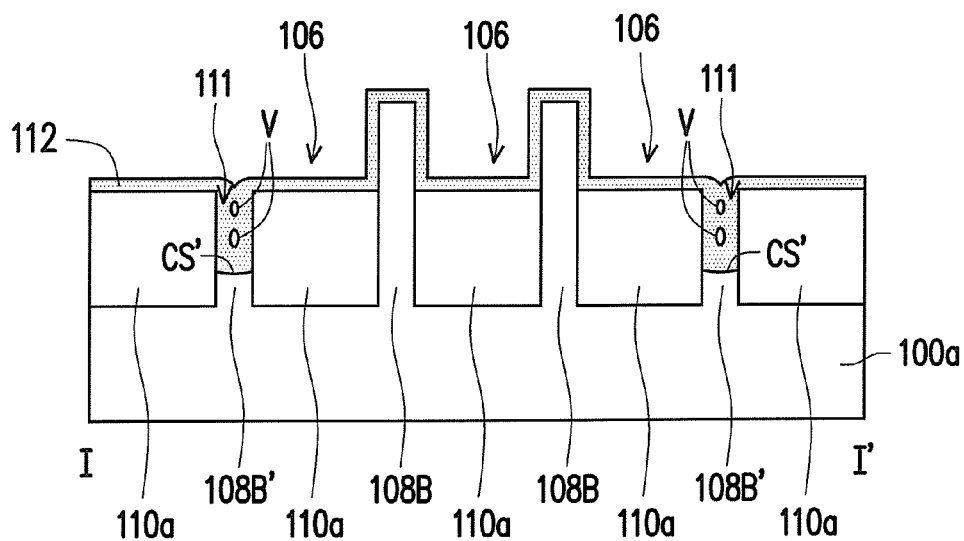

In some embodiments, the concaves 111 between the insulators 110a may be filled by the gate dielectric layer 112 and the semiconductor portion 108B' entirely. In other words, the gate dielectric layer 112 includes few void distributed in the concaves 111. In some alternative embodiments, as shown in FIG. 2H' and FIG. 3H', the gate dielectric layer 112 may include voids V distributed in the concaves 111. It is noted that the voids V in the gate dielectric layer 112 may enhance insulation characteristics of the gate dielectric layer 112 and provide sufficient structural strength.

Figure 2I:
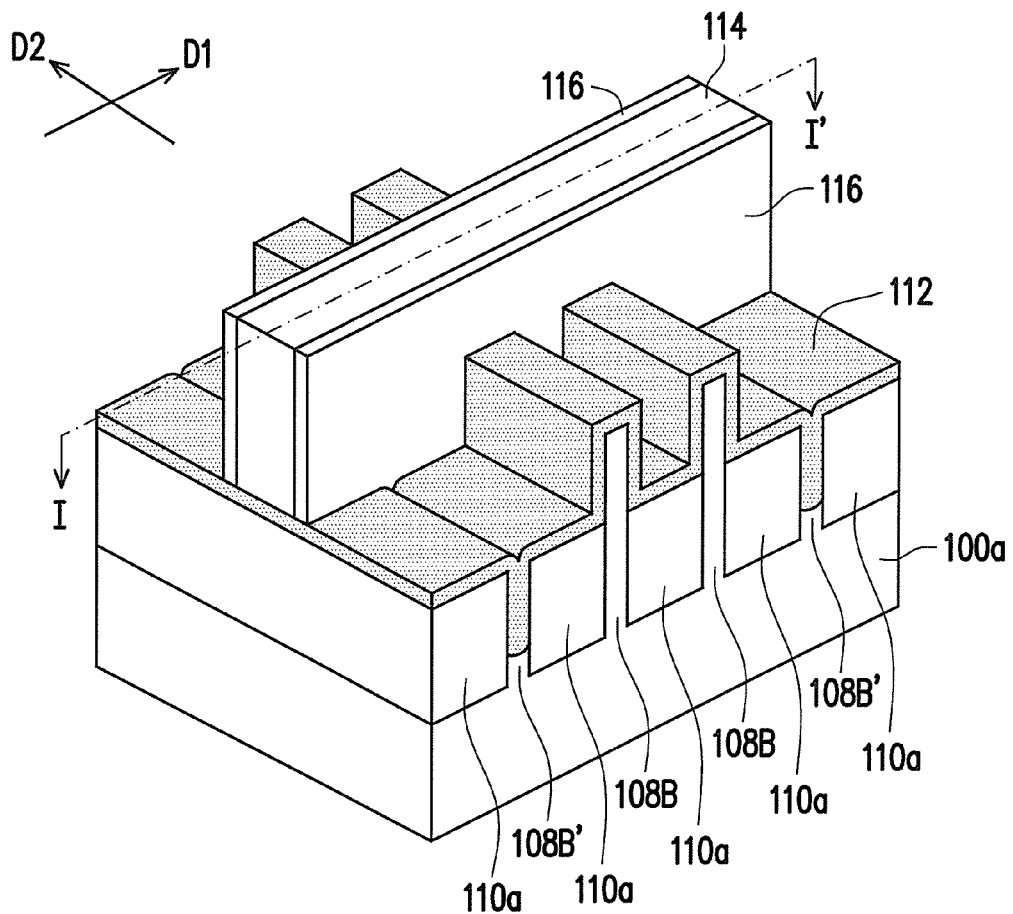
Figure 3I:
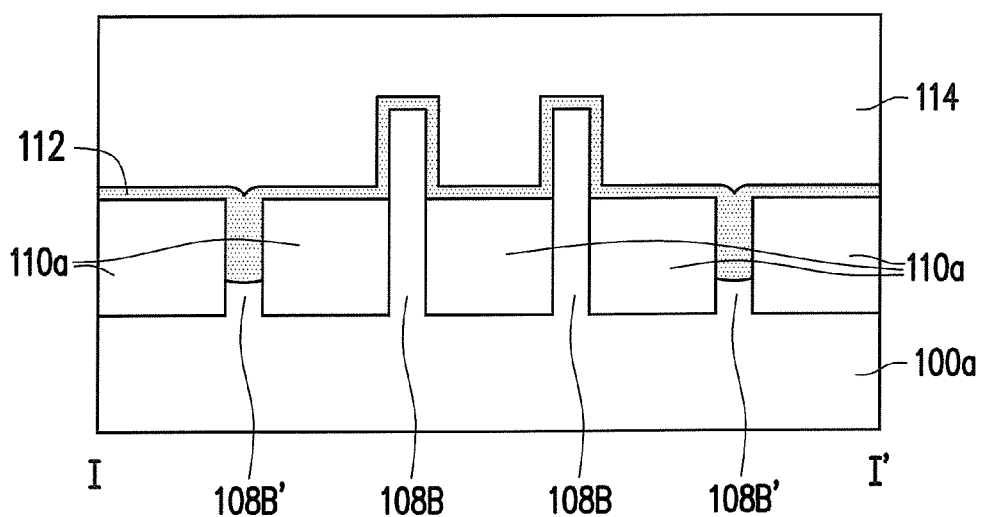
Figure 4G:
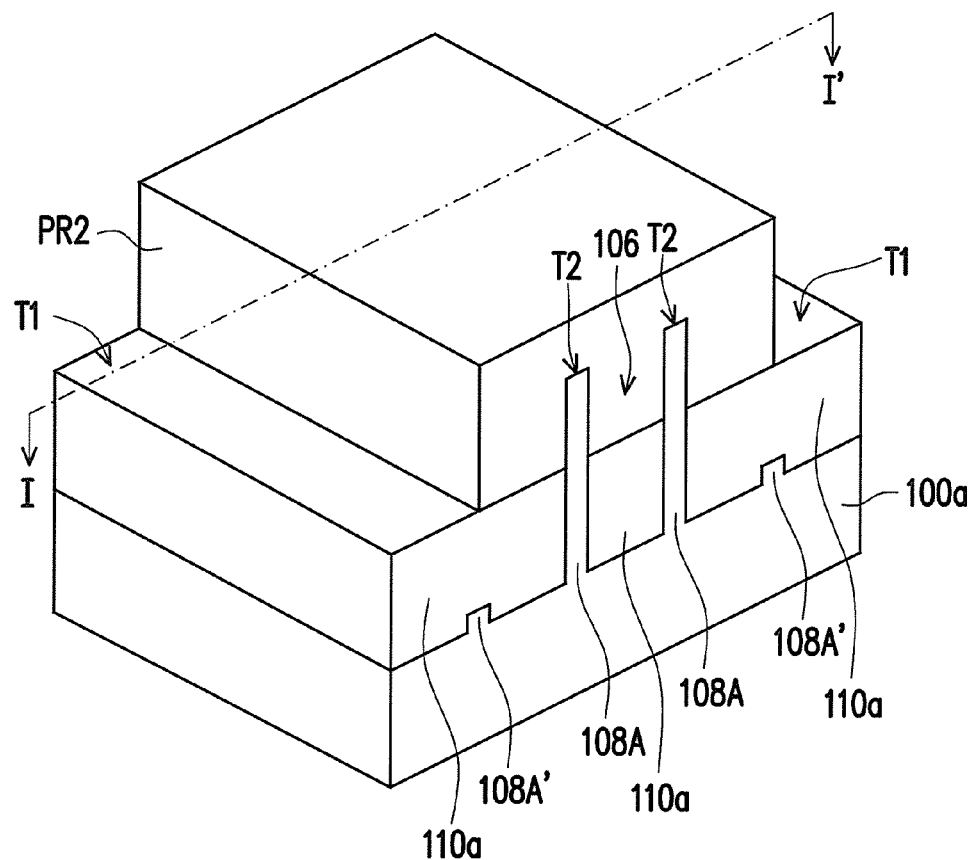
Figure 4H:
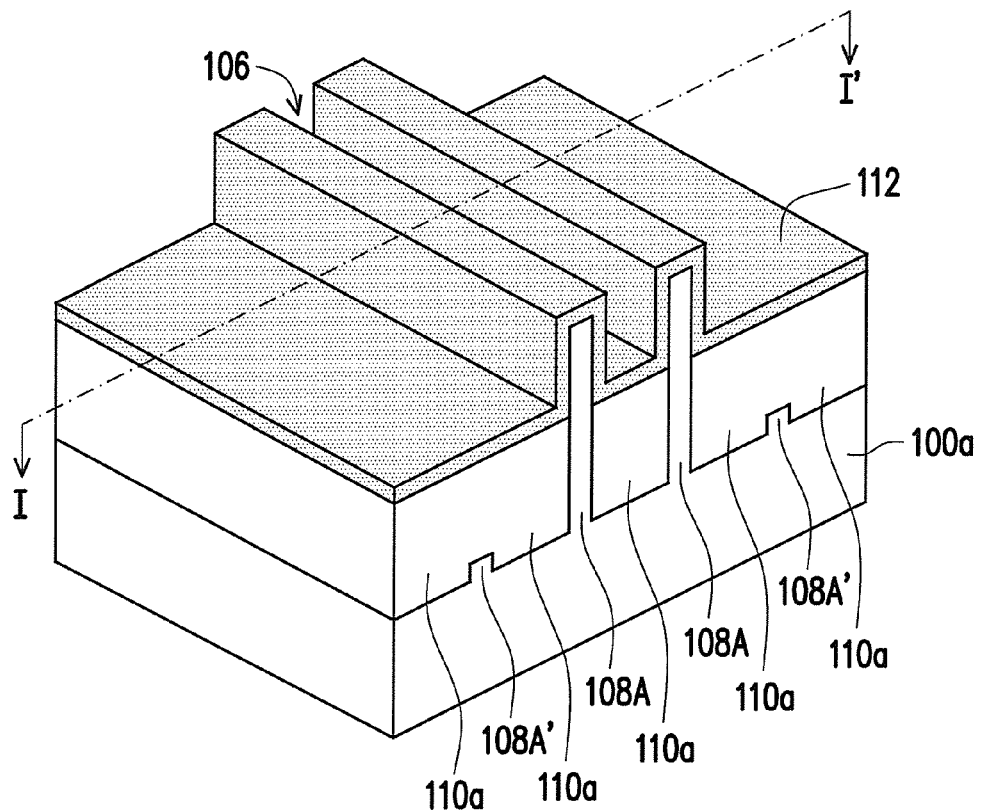
Figure 4I:
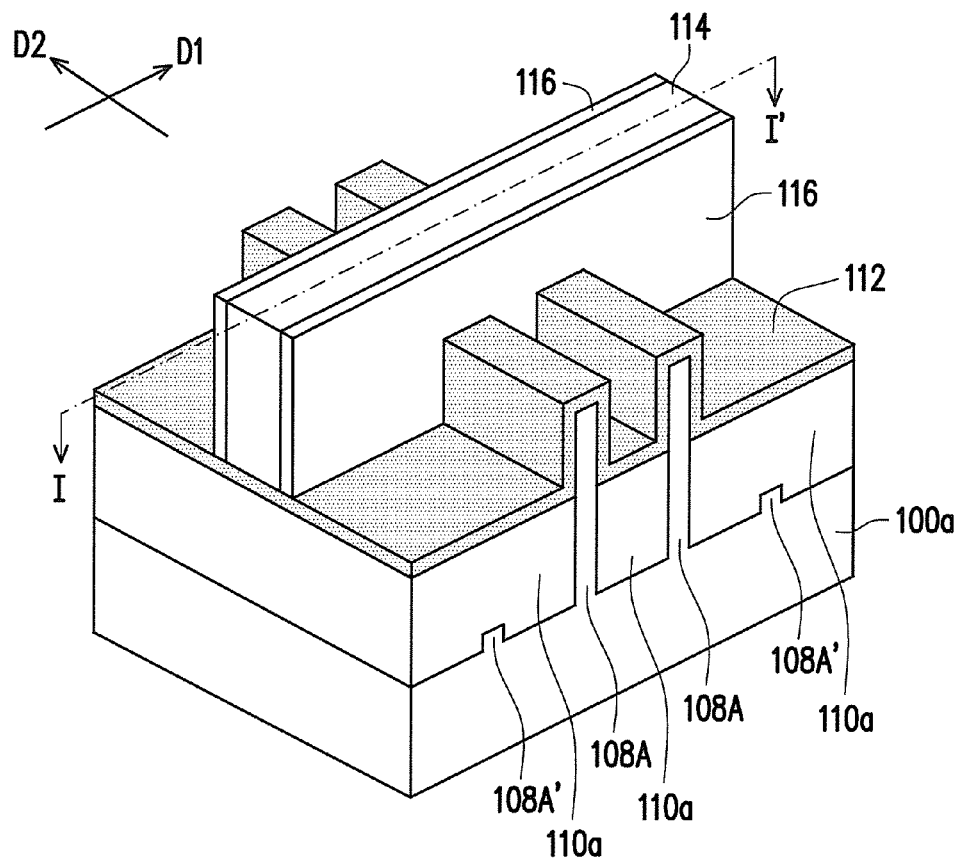
Figure 5I:
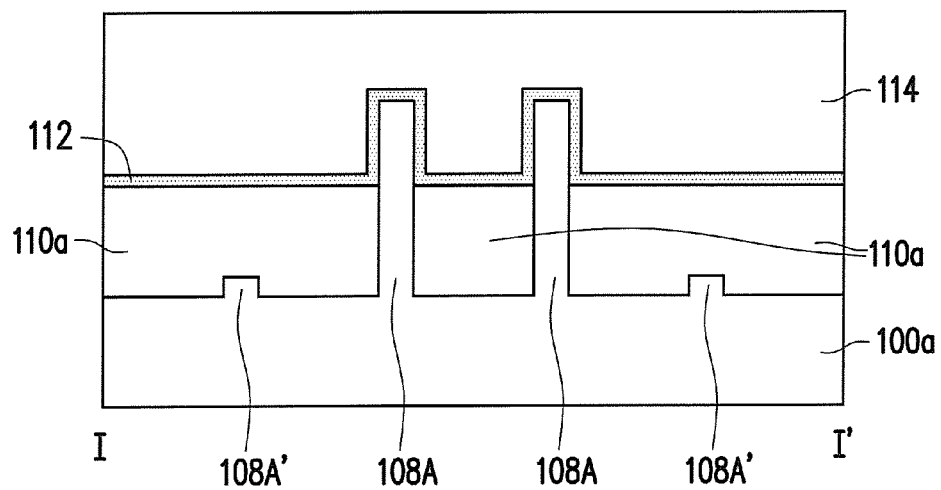

In Step S60 in FIG. 1 and as shown in FIGS. 2H-2I, 3H-3I, 4H-4I and 5H-5I, dummy gate strips 114 are formed on the gate dielectric layer 112, wherein a lengthwise direction D1 of the dummy gate strips 114 is different from the lengthwise direction D2 of the first and second semiconductor fins 108A, 108B. In some embodiments, the lengthwise direction D1 of the dummy gate strips 114 is perpendicular to the lengthwise direction D2 of the first and second semiconductor fins 108A, 108B. The number of the dummy gate strips 114 shown in FIG. 2I and FIG. 4I is merely for illustration, in some alternative embodiments, two or more parallel dummy gate strips may be formed in the first area and the second area in accordance with actual design requirements. The dummy gate strips 114 include silicon-containing material, such as poly-silicon, amorphous silicon or a combination thereof.

As shown in FIG. 2I and FIG. 4I, after the dummy gate strips 114 are formed, pairs of spacers 116 are formed on sidewalls of the dummy gate strip 114. The pairs of spacers 116 are formed on the gate dielectric layer 112 and extend along the sidewalls of the dummy gate strips 114. In other words, the pair of spacers 116 extend along the lengthwise direction D1. The pairs of spacers 116 are formed of dielectric materials, such as silicon nitride or SiCON. The pairs of spacers 116 may include a single layer or multilayer structure.

In Step S60 in FIG. 1 and as shown in FIGS. 2I-2J, 3I-3J, 4I-4J and 5I-5J, a patterned dielectric layer 118 is formed to cover the gate dielectric layer 112 that are not covered by the dummy gate strips 114 and the spacers 116. A top surface of the patterned dielectric layer 118 is substantially coplanar with the top surface of the dummy gate strips 114, for example. In some embodiments, before the patterned dielectric layer 118 is formed, some processes (e.g., patterning process of gate dielectric layer 112, recessing process of the first and second semiconductor fin 108A and 108B, strained source/drain epitaxial process on the semiconductor fin 108, silicidation process and so on) may be performed in advance. Details of the aforesaid optional processes are omitted.

Figure 2J:
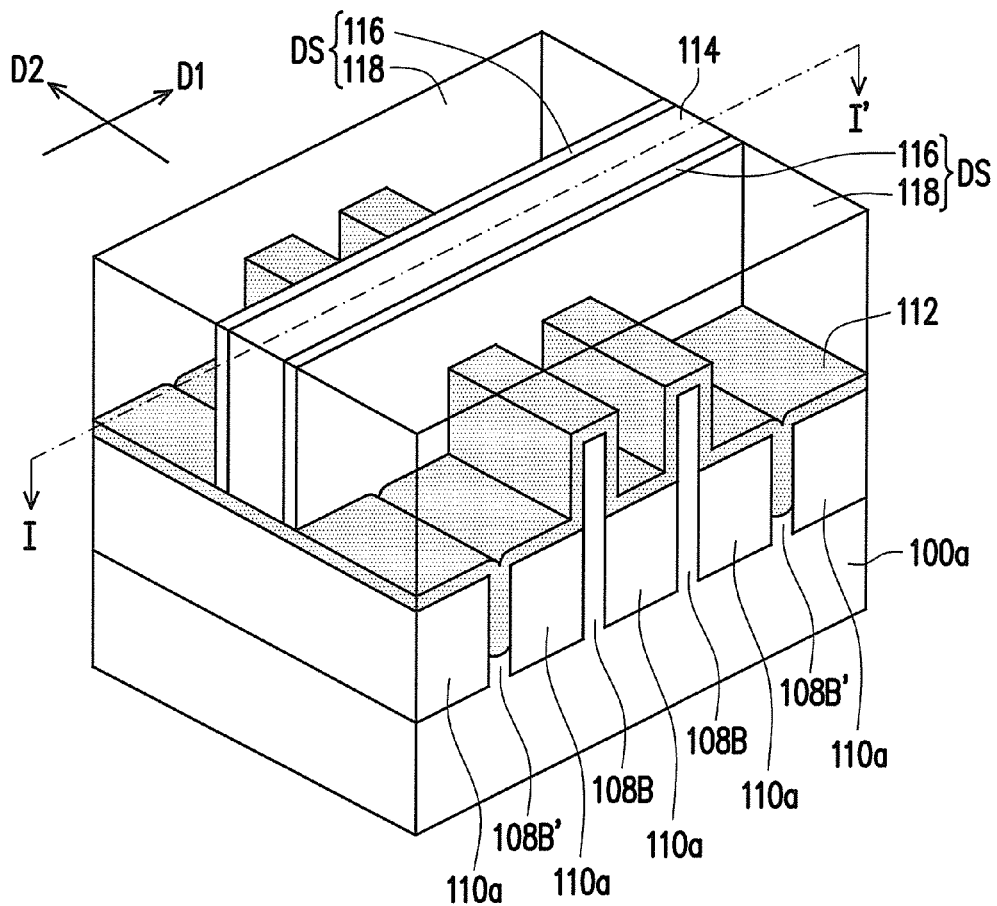
Figure 3J:
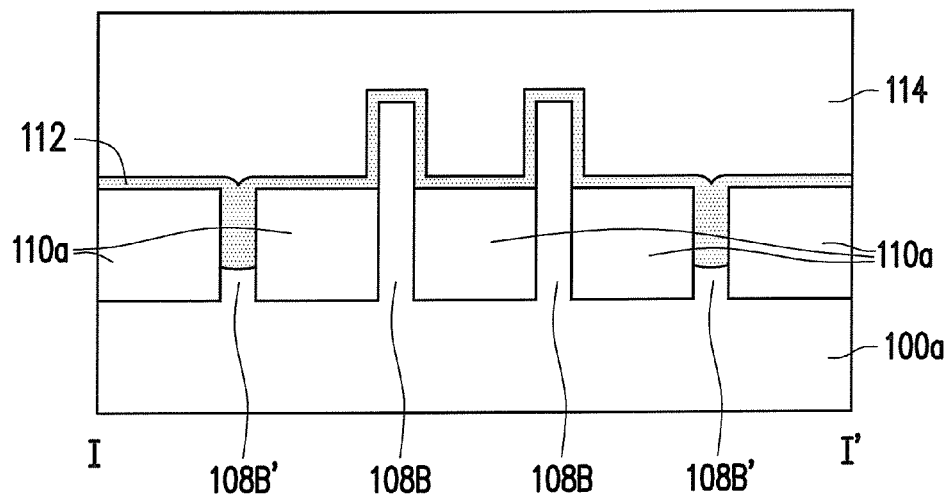
Figure 2K:
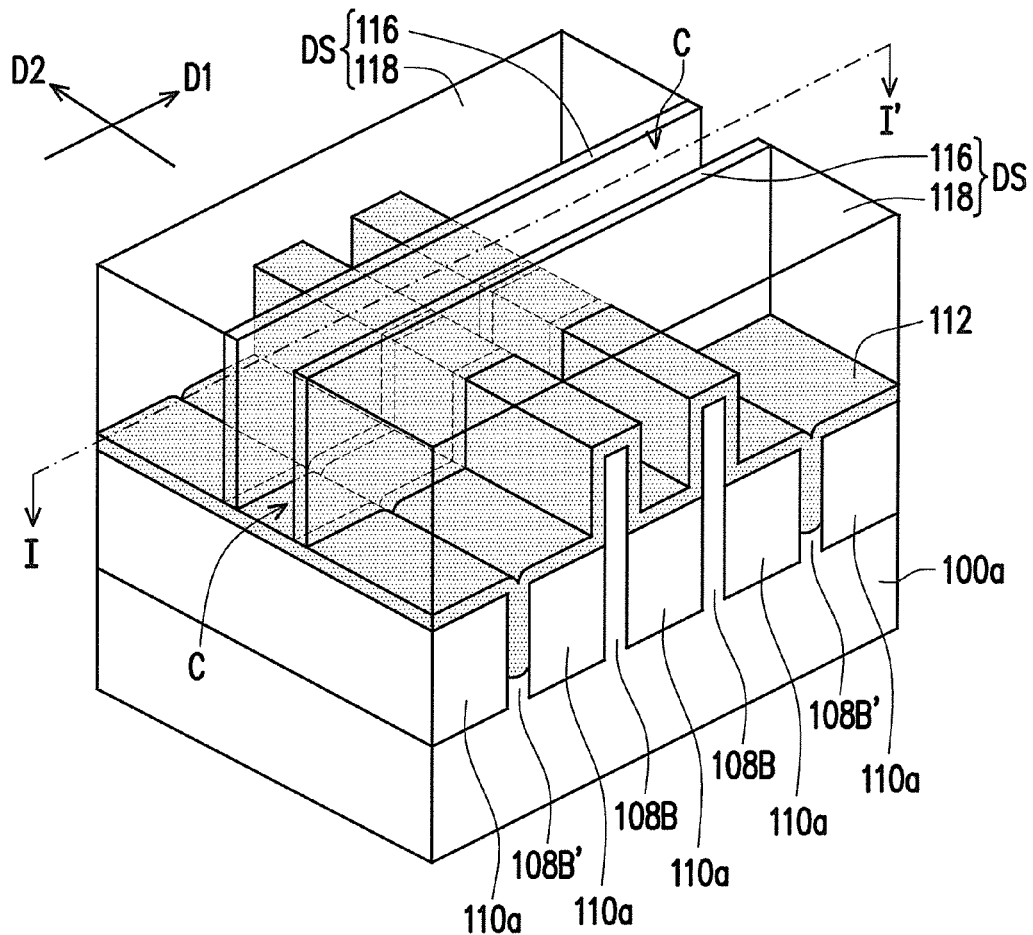
Figure 3K:
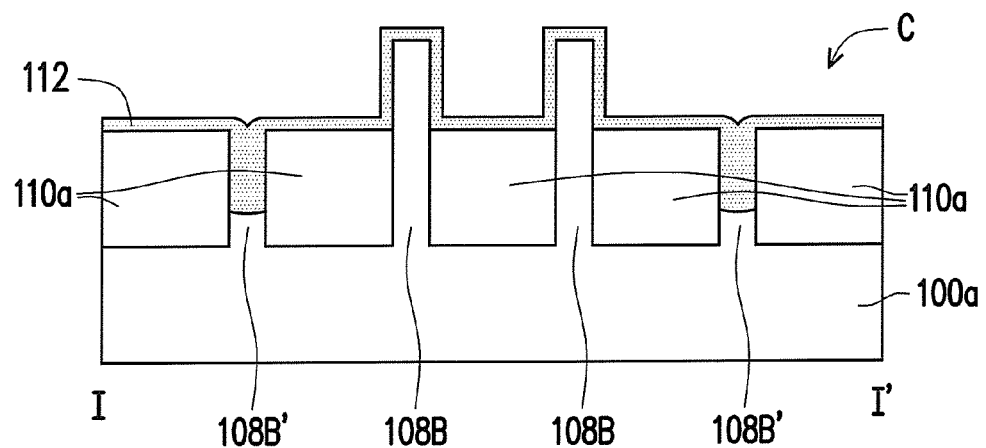
Figure 2L:
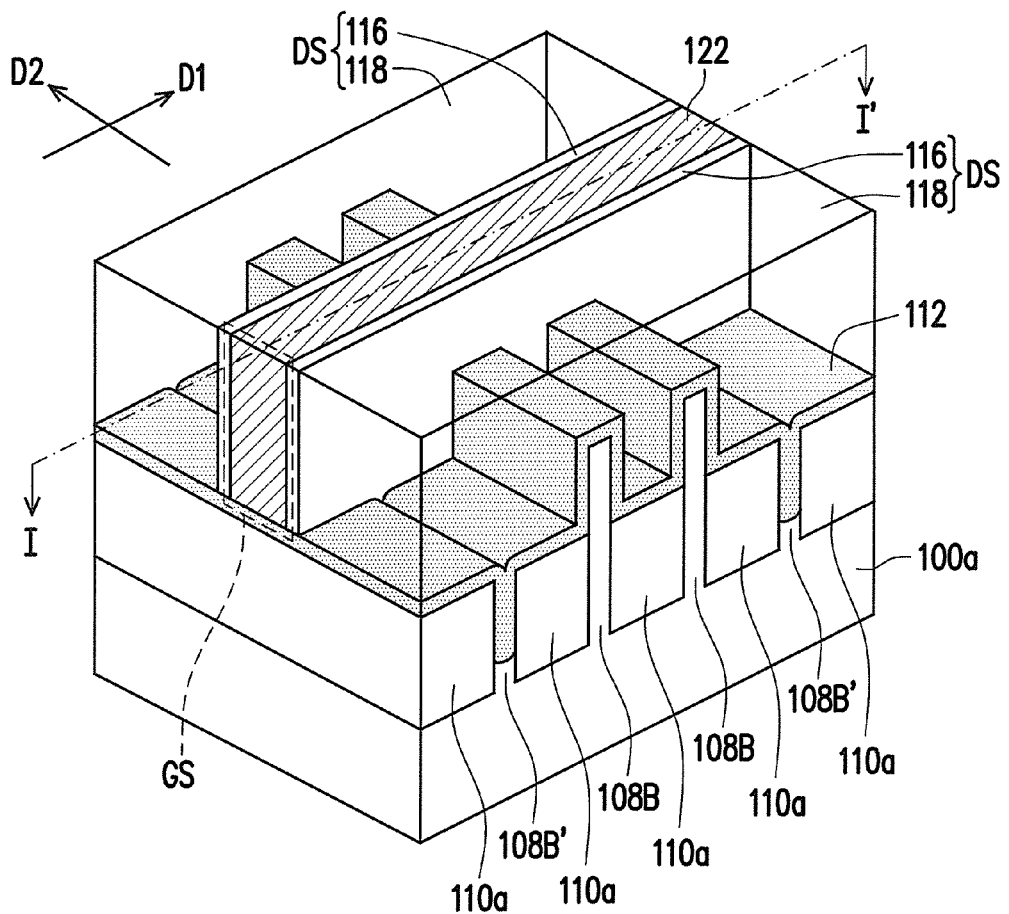
Figure 3L:
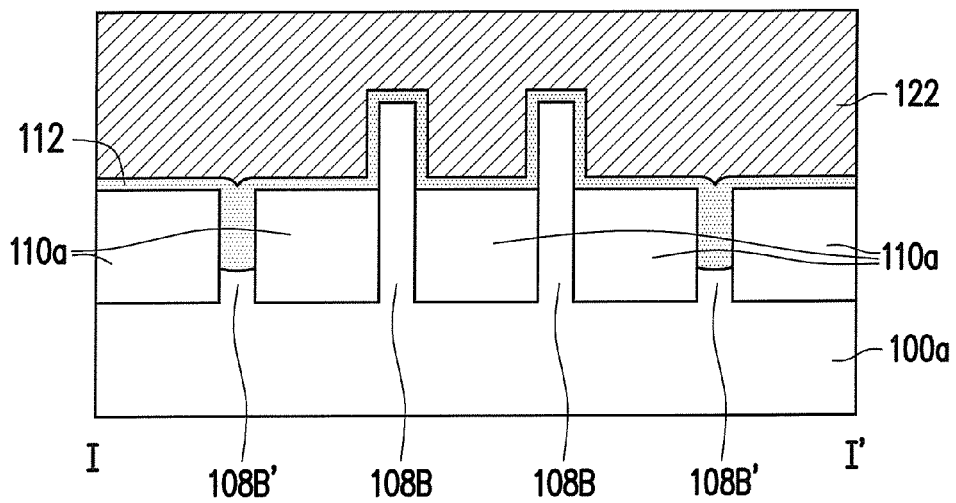
Figure 4J:
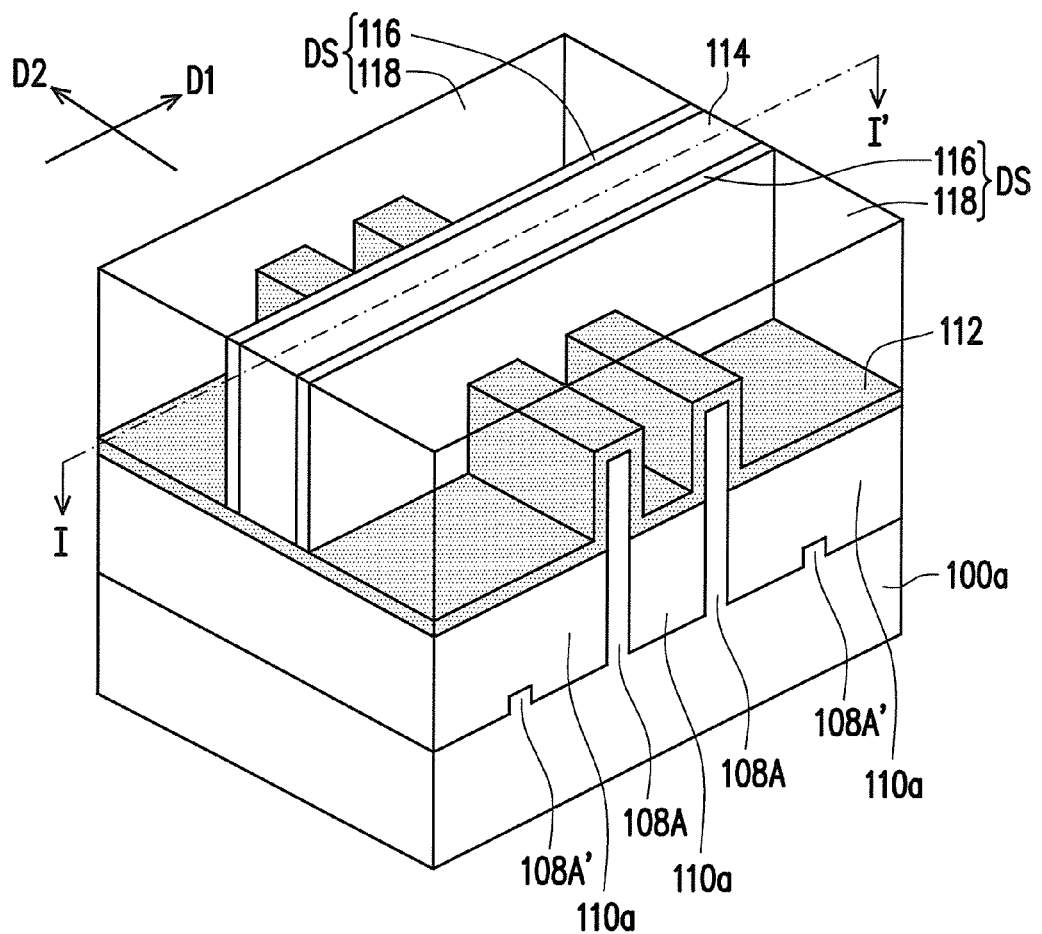
Figure 5J:
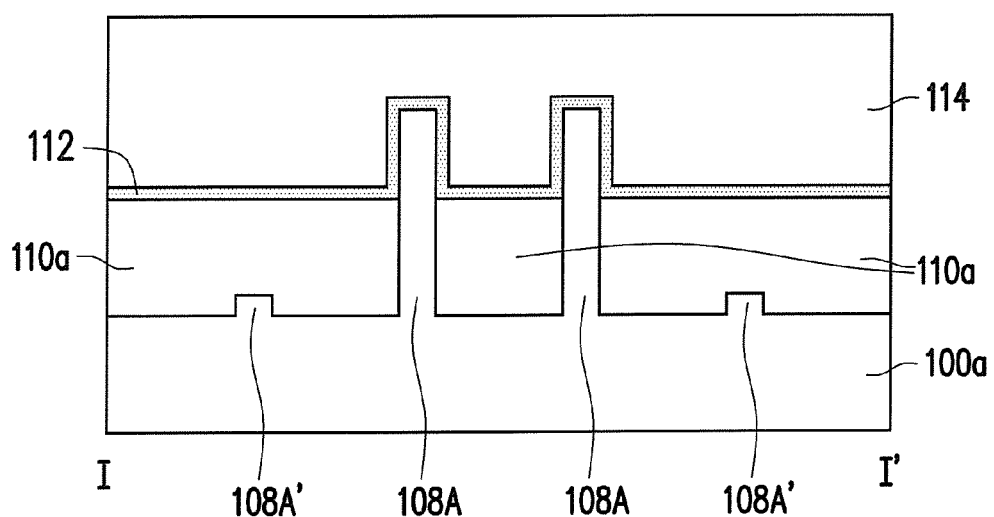
Figure 4K:
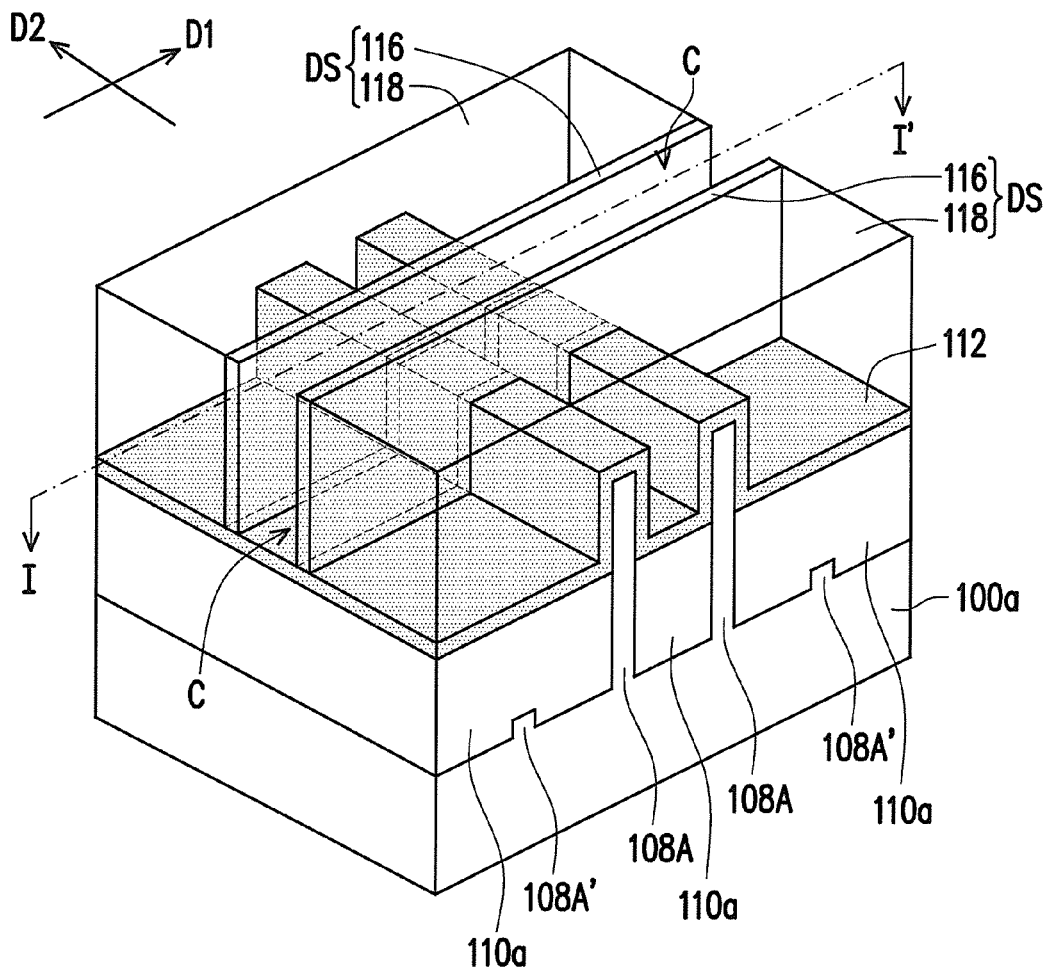
Figure 5K:
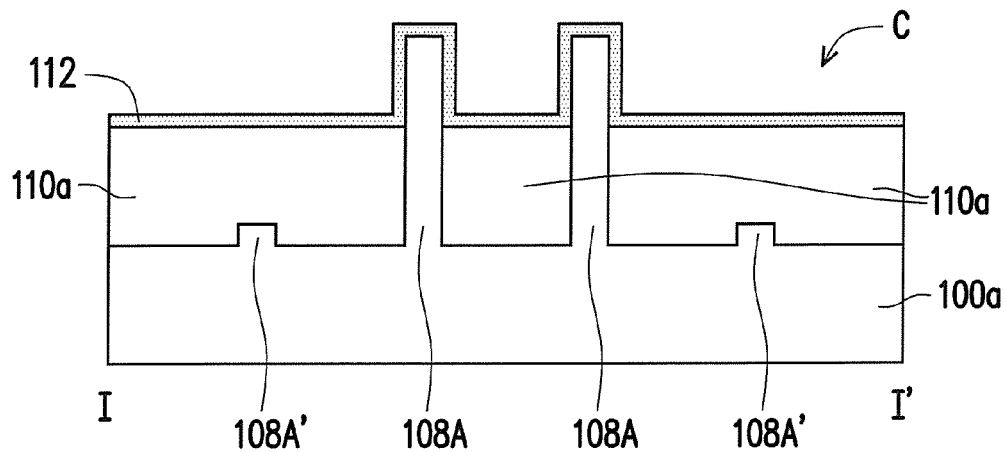
Figure 4L:
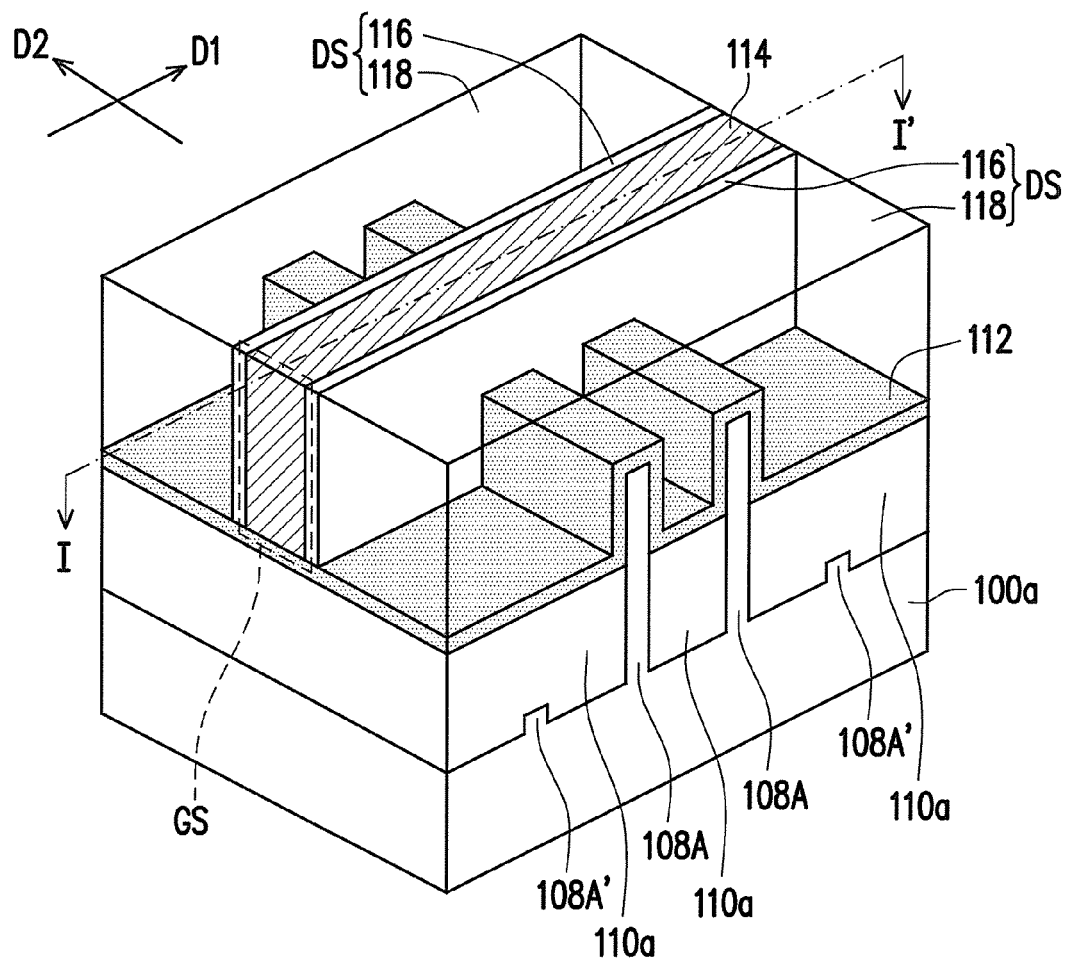
Figure 5L:
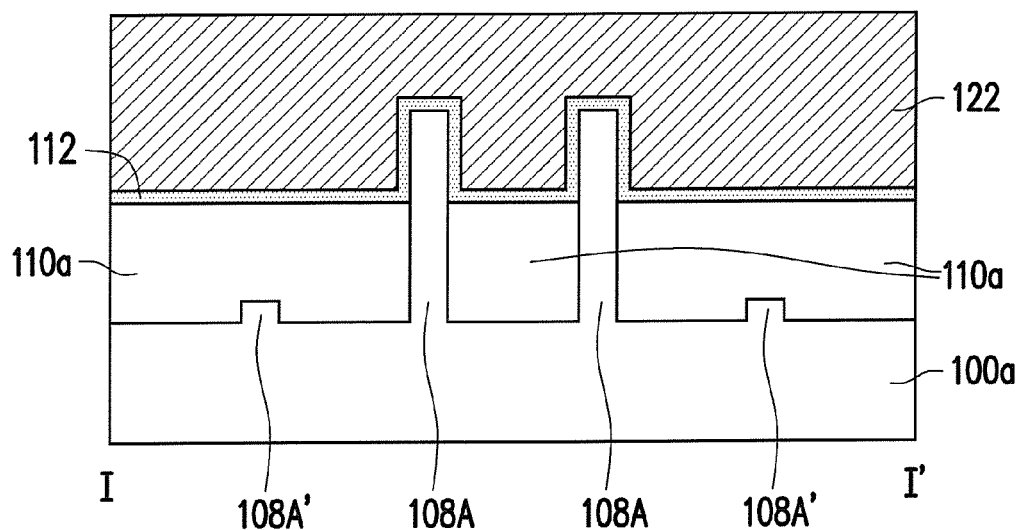

As shown in FIG. 2J and FIG. 4J, the combination of the pairs of spacers 116 and the patterned dielectric layer 118 may be considered as a dielectric structure DS adjacent to the dummy gate strips 114. In other words, the dummy gate strips 114 may be embedded in the dielectric structure DS and the dielectric structure DS partially covers the first semiconductor fins 108A, the second semiconductor fins 108B and the insulators 110a.

In Step S60 in FIG. 1 and as shown in FIGS. 2J-2K, 3J-3K, 4J-4K and 5J-5K, the dummy gate strip 114 is removed. In some embodiments, the dummy gate strips 114 are removed, for example, by an etching process. Through properly selecting of etchant, the dummy gate strips 114 are removed without damaging the patterned dielectric layers 118, the gate dielectric layer 112 and the spacers 116 significantly. After the dummy gate strips 114 are removed, cavities C between the pairs of spacers 116 are formed. In other words, the dielectric gate layer 112 is partially exposed by the cavities C.

In Step S60 in FIG. 1 and as shown in FIGS. 2K-2L, 3K-3L, 4K-4L and 5K-5L, after the cavities C are formed, gates 122 are formed in and fill the cavities C and the gates 122 cover the gate dielectric layer 112 exposed by the cavities C. The width of the gates 122 is substantially identical with the width of the dummy gate strips 114 (as shown in FIG. 2I and FIG. 4I). The channel length of the FinFETs is relevant to or is determined by the width of the gates 122. In other words, the portions of the first and second semiconductor fins 108A, 108B that are overlapped with and covered by the corresponding gate 122 serve as channels of the FinFETs, respectively.

As shown in FIGS. 2L, 3L, 4L and 5L, in one embodiment, the gates 122 and the gate dielectric layer 112 underneath are considered as gate stacks GS, the dielectric structure DS (e.g., the pair of spacers 116 or the combination of the pair of spacers 116 and the patterned dielectric layer 118) is formed on sidewalls of the gate stacks GS, and the top surface of the dielectric structure DS is substantially coplanar with a top surface of the gate stacks GS, for example. In some alternative embodiments, the above-illustrated gate replacement process (FIGS. 2K-2L and FIGS. 3K-3L) may be omitted.

In embodiments of the disclosure, since the above-mentioned second fin cut process is performed after the insulators are formed, the remaining semiconductor fins can be protected properly. Accordingly, performance (e.g., leakage, Cp yield and so on), reliability and process control (e.g., process window) of semiconductor device or FinFETs may be enhanced.

In accordance with some embodiments of the present disclosure, a method for fabricating a semiconductor device comprising the following steps is provided. A substrate having a first area and a second area is provided. The substrate is patterned to form a plurality of trenches in the substrate and a plurality of semiconductor fins between the trenches, wherein the semiconductor fins comprises a plurality of first semiconductor fins distributed in the first area and a plurality of second semiconductor fins distributed in the second area. A first fin cut process is performed in the first area to remove portions of the first semiconductor fins.

A plurality of insulators are formed in the trenches after the first fin cut process is performed. A second fin cut process is performed in the second area to remove portions of the second semiconductor fins until a plurality of concaves are formed between the insulators in the second area. A gate stack is formed to partially cover the first semiconductor fins, the second semiconductor fins and the insulators.

In accordance with alternative embodiments of the present disclosure, a method for fabricating a semiconductor device comprising the following steps is provided. A substrate having a first area and a second area is provided. The substrate is patterned to form a plurality of trenches in the substrate and a plurality of semiconductor fins between the trenches, wherein the semiconductor fins comprises a plurality of first semiconductor fins distributed in the first area and a plurality of second semiconductor fins distributed in the second area. A first fin cut process is performed in the first area. A plurality of insulators in the trenches are formed after the first fin cut process is performed. Then, a second fin cut process in the second area. Thereafter, a gate dielectric layer is formed to fill the concaves and to cover the insulators and the semiconductor fins. A gate is formed on the gate dielectric layer. The first fin cut process comprises the following steps. A first patterned photoresist layer is formed to partially cover the first semiconductor fins, wherein the second semiconductor fins are covered by the first patterned photoresist layer. Portions of the first semiconductor fins uncovered by the first patterned photoresist layer are removed. The first patterned photoresist layer is removed after the portions of the first semiconductor fins are removed. The second fin cut process comprises the following steps. A second patterned photoresist layer is formed to partially cover the second semiconductor fins, wherein the first semiconductor fins are covered by the second patterned photoresist layer. Portions of the second semiconductor fins uncovered by the second patterned photoresist layer are removed until the concaves are formed between the insulators in the second area. The second patterned photoresist layer is removed after the concaves are formed In accordance with yet alternative embodiments of the present disclosure, a semiconductor device comprising a substrate, a plurality of insulators, a gate dielectric layer and a gate is provided. The substrate comprises a plurality of trenches and at least one semiconductor fin between the trenches. The semiconductor fins comprises a plurality of first semiconductor fins distributed in the first area and a plurality of second semiconductor fins distributed in the second area. The insulators are disposed in the trenches, wherein two of the insulators distributed in the first area are spaced apart by one of the first semiconductor fins and at least two of the insulators distributed in the second area are spaced apart by at least one concave therebetween. The at least one concave is filled by the gate dielectric layer. The gate dielectric layer covers the insulators, the first semiconductor fins and the second semiconductor fins. The gate is disposed on the gate dielectric layer, and the gate partially covers the insulators, the first semiconductor fins and the second semiconductor fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, comprising:
    providing a substrate having a first area and a second area;
    patterning the substrate to form a plurality of trenches in the substrate and a plurality of semiconductor fins between the plurality of trenches, the plurality of semiconductor fins comprising a plurality of first semiconductor fins distributed in the first area and a plurality of second semiconductor fins distributed in the second area;
    performing a first fin cut process in the first area to remove portions of the plurality of first semiconductor fins;
    forming a plurality of insulators in the plurality of trenches after the first fin cut process is performed;
    performing a second fin cut process in the second area to remove portions of the plurality of second semiconductor fins until a plurality of concaves are formed between the plurality of insulators in the second area;
    forming a gate dielectric layer to fill the plurality of concaves and to cover the plurality of insulators and the plurality of first semiconductor fins;
    forming a gate on the gate dielectric layer, wherein the gate does not extend into the plurality of concaves.

2. The method of claim 1, wherein the first fin cut process comprises:
    forming a first patterned photoresist layer to partially cover the plurality of first semiconductor fins, wherein the plurality of second semiconductor fins are covered by the first patterned photoresist layer;
    removing the portions of the first plurality of semiconductor fins uncovered by the first patterned photoresist layer; and
    removing the first patterned photoresist layer after the portions of the plurality of first semiconductor fins are removed.

3. The method of claim 1, wherein the second fin cut process comprises:
    forming a second patterned photoresist layer to partially cover the plurality of second semiconductor fins, wherein the plurality of first semiconductor fins are covered by the second patterned photoresist layer;
    removing the portions of the plurality of second semiconductor fins uncovered by the second patterned photoresist layer until the plurality of concaves are formed between the plurality of insulators in the second area; and
    removing the second patterned photoresist layer after the plurality of concaves are formed.

4. The method of claim 1, wherein a plurality of curved surfaces of the substrate are formed and exposed by the plurality of concaves after the second fin cut process is performed.

5. The method of claim 1, wherein the portions of the plurality of first semiconductor fins are removed to form a plurality of first semiconductor portions and the portions of the plurality of second semiconductor fins are removed to form a plurality of second semiconductor portions between the plurality of insulators.

6. The method of claim 1, wherein a bottom surface of the gate is higher than a top surface of the plurality of insulators.

7. The method of claim 1, wherein a plurality of curved surfaces of the substrate are formed and exposed by the plurality of concaves after the second fin cut process is performed, and the plurality of curved surfaces exposed by the plurality of concaves are covered by the gate dielectric layer.

8. The method of claim 1, wherein the portions of the plurality of first semiconductor fins are removed to form a plurality of first semiconductor portions, the portions of the plurality of second semiconductor fins are removed to form a plurality of second semiconductor portions exposed by the plurality of concaves, and the plurality of second semiconductor portions exposed by the plurality of concaves are covered by the gate dielectric layer.

9. The method of claim 1, wherein the gate dielectric layer comprises a plurality of voids distributed in the plurality of concaves.

10. A method for fabricating a fin field effect transistor (FinFET), comprising:
providing a substrate having a first area and a second area;
patterning the substrate to form a plurality of trenches in the substrate and a plurality of semiconductor fins between the plurality of trenches, the plurality of semiconductor fins comprising a plurality of first semiconductor fins distributed in the first area and a plurality of second semiconductor fins distributed in the second area;
performing a first fin cut process in the first area, the first fin cut process comprising:
 forming a first patterned photoresist layer to partially cover the plurality of first semiconductor fins, wherein the plurality of second semiconductor fins are covered by the first patterned photoresist layer;
 removing portions of the plurality of first semiconductor fins uncovered by the first patterned photoresist layer;
 removing the first patterned photoresist layer after the portions of the plurality of first semiconductor fins are removed;
forming a plurality of insulators in the plurality of trenches after the first fin cut process is performed;
performing a second fin cut process in the second area, the second fin cut process comprising:
 forming a second patterned photoresist layer to partially cover the plurality of second semiconductor fins, wherein the plurality of first semiconductor fins are covered by the second patterned photoresist layer;
 removing portions of the plurality of second semiconductor fins uncovered by the second patterned photoresist layer until a plurality of concaves are formed between the plurality of insulators in the second area;
 removing the second patterned photoresist layer after the plurality of concaves are formed;
forming a gate dielectric layer, the gate dielectric layer filling the plurality of concaves and covering the plurality of insulators, and the plurality of first semiconductor fins;
forming a dummy gate strip on the gate dielectric layer and forming a pair of spacers on sidewalls of the dummy gate strip, the dummy gate strip being formed over the plurality of concaves; and
removing the dummy gate strip and forming a gate after the dummy gate strip is removed.

11. The method of claim 10, wherein a plurality of curved surfaces of the substrate are formed and exposed by the plurality of concaves after the second fin cut process is performed, and the plurality of curved surfaces exposed by the plurality of concaves are covered by the gate dielectric layer.

12. The method of claim 10, wherein the portions of the plurality of first semiconductor fins are removed to form a plurality of first semiconductor portions, the portions of the plurality of second semiconductor fins are removed to form a plurality of second semiconductor portions exposed by the plurality of concaves, and the plurality of second semiconductor portions exposed by the plurality of concaves are covered by the gate dielectric layer.

13. The method of claim 12, wherein the plurality of first semiconductor portions are covered by the plurality of insulators.

14. The method of claim 10, wherein the gate dielectric layer comprises a plurality of voids distributed in the plurality of concaves.

15. A semiconductor device, comprising:
a substrate having a first area and a second area, wherein the substrate comprises a plurality of trenches in the substrate and a plurality of semiconductor fins between the plurality of trenches, and the plurality of semiconductor fins comprises a plurality of first semiconductor fins distributed in the first area and a plurality of second semiconductor fins distributed in the second area;
a plurality of insulators in the plurality of trenches, wherein two of the plurality of insulators distributed in the first area are spaced apart by one of the plurality of first semiconductor fins and at least two of the plurality of insulators distributed in the second area are spaced apart by at least one concave therebetween;
a gate dielectric layer, the at least one concave being filled by the gate dielectric layer, and the gate dielectric layer covering the plurality of insulators, the plurality of first semiconductor fins and the plurality of second semiconductor fins; and
a gate disposed on the gate dielectric layer, the gate partially covering the plurality of insulators, the plurality of first semiconductor fins and the plurality of second semiconductor fins, wherein the gate does not extend into the at least one concave.

16. The semiconductor device of claim 15, wherein a width of the at least one concave equals to a width of the plurality of second semiconductor fins.

17. The semiconductor device of claim 15, wherein at least one curved surface of the substrate is exposed by the at least one concave and is covered by the gate dielectric layer.

18. The semiconductor device of claim 15, wherein the substrate comprises at least one semiconductor portion located in the at least one concave and the at least one semiconductor portion is covered by the gate dielectric layer.

19. The semiconductor device of claim 18, wherein the at least one concave is filled by the gate dielectric layer and the at least one semiconductor portion.

20. The semiconductor device of claim 15, wherein the gate dielectric layer comprises a plurality of voids distributed in the at least one concave.

* * * * *